(12) United States Patent
Basu et al.

(10) Patent No.: US 10,917,994 B2
(45) Date of Patent: Feb. 9, 2021

(54) WICKLESS CAPILLARY DRIVEN CONSTRAINED VAPOR BUBBLE HEAT PIPES FOR APPLICATION IN RACK SERVERS

(71) Applicant: Intel Corporation, Santa Clara, CA (US)

(72) Inventors: Sumita Basu, Portland, OR (US); Shantanu D. Kulkarni, Hillsboro, OR (US); Prosenjit Ghosh, Portland, OR (US); Konstantin I. Kouliachev, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 415 days.

(21) Appl. No.: 15/393,258

(22) Filed: Dec. 29, 2016

(65) Prior Publication Data

US 2017/0314874 A1 Nov. 2, 2017

Related U.S. Application Data

(60) Provisional application No. 62/329,359, filed on Apr. 29, 2016.

(51) Int. Cl.
*H05K 7/20* (2006.01)
*F28D 15/02* (2006.01)
(Continued)

(52) U.S. Cl.
CPC ........... *H05K 7/20336* (2013.01); *F28C 3/08* (2013.01); *F28D 15/025* (2013.01);
(Continued)

(58) Field of Classification Search
CPC ........... H05K 7/20336; H05K 7/20681; H05K 7/20818; F28D 15/0233; F28D 15/0266;
(Continued)

(56) References Cited

U.S. PATENT DOCUMENTS

| 2,434,519 A | 1/1948 | Raskin |
| 3,251,410 A | 5/1966 | Raskin |

(Continued)

FOREIGN PATENT DOCUMENTS

| FR | 2998657 | 5/2014 |
| JP | 9191440 | 7/1997 |

(Continued)

OTHER PUBLICATIONS

United States Patent and Trademark Office, "Final Office action," issued in connection with U.S. Appl. No. 15/393,251, dated Jan. 15, 2019, 17 pages.

(Continued)

*Primary Examiner* — Leonard R Leo
(74) *Attorney, Agent, or Firm* — Hanley, Flight and Zimmerman, LLC

(57) ABSTRACT

A system and method for providing and using wickless capillary driven constrained vapor bubble heat pipes for application in rack servers are disclosed. An example embodiment includes: a base structure; and a rack column supported by the base structure, the rack column in thermal coupling with a heat-generating device, the rack column containing a constrained vapor bubble (CVB) cell cluster including a plurality of cells in thermal coupling with the heat-generating device at a first end in an evaporator region and in thermal coupling with the base structure at a second end in a condenser region, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between the evaporator region and the condenser region.

11 Claims, 26 Drawing Sheets

(51) Int. Cl.
| | |
|---|---|
| *G06F 1/20* | (2006.01) |
| *H05K 1/02* | (2006.01) |
| *H01L 21/48* | (2006.01) |
| *H01L 23/427* | (2006.01) |
| *H01L 23/538* | (2006.01) |
| *H05K 1/18* | (2006.01) |
| *H05K 3/00* | (2006.01) |
| *F28D 15/04* | (2006.01) |
| *F28F 13/16* | (2006.01) |
| *F28C 3/08* | (2006.01) |
| *G06F 1/16* | (2006.01) |
| *H05K 5/00* | (2006.01) |
| *F28D 21/00* | (2006.01) |
| *F21V 8/00* | (2006.01) |
| *G02F 1/1333* | (2006.01) |

(52) U.S. Cl.
CPC ..... *F28D 15/0233* (2013.01); *F28D 15/0266* (2013.01); *F28D 15/0275* (2013.01); *F28D 15/0283* (2013.01); *F28D 15/046* (2013.01); *F28F 13/16* (2013.01); *G06F 1/1601* (2013.01); *G06F 1/20* (2013.01); *G06F 1/203* (2013.01); *H01L 21/4846* (2013.01); *H01L 21/4871* (2013.01); *H01L 23/427* (2013.01); *H01L 23/5389* (2013.01); *H05K 1/0203* (2013.01); *H05K 1/0272* (2013.01); *H05K 1/185* (2013.01); *H05K 3/0017* (2013.01); *H05K 3/0044* (2013.01); *H05K 5/0017* (2013.01); *H05K 7/20318* (2013.01); *H05K 7/20809* (2013.01); *F28D 2015/0225* (2013.01); *F28D 2021/0029* (2013.01); *F28F 2215/06* (2013.01); *G02B 6/0085* (2013.01); *G02F 1/133385* (2013.01); *H05K 2201/064* (2013.01)

(58) Field of Classification Search
CPC . F28D 15/04; F28D 2015/0225; H01L 23/427
USPC .......................................... 165/104.26, 80.3
See application file for complete search history.

(56) References Cited

U.S. PATENT DOCUMENTS

| | | | |
|---|---|---|---|
| 4,116,266 A | 9/1978 | Sawata et al. | |
| 4,274,479 A | 6/1981 | Eastman | |
| 4,883,116 A | 11/1989 | Seidenberg et al. | |
| 4,995,451 A | 2/1991 | Hamburgen | |
| 5,179,043 A | 1/1993 | Weichold et al. | |
| 5,219,021 A * | 6/1993 | Edelstein | F28D 15/046 165/104.26 |
| 5,309,457 A | 5/1994 | Minch | |
| 5,309,986 A | 5/1994 | Itoh | |
| 5,329,425 A * | 7/1994 | Leyssens | H05K 7/20672 165/104.33 |
| 5,379,830 A | 1/1995 | Itoh | |
| 5,527,588 A | 6/1996 | Camarda et al. | |
| 5,598,632 A | 2/1997 | Camarda et al. | |
| 5,617,737 A * | 4/1997 | Christensen | B01D 1/02 62/487 |
| 5,660,229 A | 8/1997 | Lee et al. | |
| 5,697,428 A | 12/1997 | Akachi | |
| 5,769,154 A | 6/1998 | Adkins et al. | |
| 5,844,777 A * | 12/1998 | Gates | H05K 7/20809 361/700 |
| 5,937,936 A | 8/1999 | Furukawa et al. | |
| 6,005,649 A | 12/1999 | Krusius et al. | |
| 6,056,044 A | 5/2000 | Benson et al. | |
| 6,062,302 A | 5/2000 | Davis et al. | |
| 6,164,368 A | 12/2000 | Furukawa et al. | |
| 6,237,223 B1 * | 5/2001 | McCullough | F28D 15/046 29/890.032 |
| 6,293,333 B1 | 9/2001 | Ponnappan et al. | |
| 6,374,905 B1 | 4/2002 | Tantoush | |
| 6,477,045 B1 | 11/2002 | Wang | |
| 6,725,910 B2 | 4/2004 | Ishida et al. | |
| 6,758,263 B2 | 7/2004 | Krassowski et al. | |
| 6,917,522 B1 | 7/2005 | Erturk et al. | |
| 7,080,683 B2 | 7/2006 | Bhatti et al. | |
| 7,261,143 B2 * | 8/2007 | Chen | F28D 15/046 165/104.26 |
| 7,727,847 B2 | 6/2010 | Tanaka et al. | |
| 7,848,624 B1 | 12/2010 | Zimbeck et al. | |
| 7,978,472 B2 | 7/2011 | Campbell et al. | |
| 8,235,096 B1 | 8/2012 | Mahefkey et al. | |
| 8,351,207 B2 | 1/2013 | Jang et al. | |
| 8,434,225 B2 | 5/2013 | Mahefkey et al. | |
| 8,737,071 B2 | 5/2014 | Hao et al. | |
| 9,921,003 B2 | 3/2018 | Monson et al. | |
| 10,219,409 B2 | 2/2019 | Basu et al. | |
| 2004/0112572 A1 | 6/2004 | Moon et al. | |
| 2004/0257768 A1 | 12/2004 | Ohmi et al. | |
| 2005/0141197 A1 | 6/2005 | Erturk et al. | |
| 2006/0157228 A1 | 7/2006 | Moon et al. | |
| 2006/0245214 A1 | 11/2006 | Kim | |
| 2007/0019419 A1 | 1/2007 | Hafuka et al. | |
| 2007/0107875 A1 | 5/2007 | Lee et al. | |
| 2007/0130769 A1 | 6/2007 | Moon et al. | |
| 2007/0240855 A1 | 10/2007 | Hou et al. | |
| 2007/0240858 A1 | 10/2007 | Hou et al. | |
| 2008/0062649 A1 | 3/2008 | Leng et al. | |
| 2008/0142196 A1 | 6/2008 | Jeng | |
| 2008/0185128 A1 | 8/2008 | Moon et al. | |
| 2009/0009974 A1 | 1/2009 | Tseng et al. | |
| 2009/0011547 A1 | 1/2009 | Lu et al. | |
| 2009/0016023 A1 | 1/2009 | Cao et al. | |
| 2009/0188110 A1 | 7/2009 | Moon et al. | |
| 2009/0266514 A1 | 10/2009 | Agostin et al. | |
| 2009/0323276 A1 | 12/2009 | Mongia et al. | |
| 2010/0006846 A1 | 1/2010 | Nakamura et al. | |
| 2010/0132923 A1 * | 6/2010 | Batty | F28D 15/046 165/104.26 |
| 2011/0203777 A1 | 8/2011 | Zhao et al. | |
| 2011/0209864 A1 | 9/2011 | Figus et al. | |
| 2012/0012604 A1 | 1/2012 | Pfister et al. | |
| 2012/0145358 A1 | 6/2012 | Moon | |
| 2012/0162918 A1 * | 6/2012 | Thyni | H05K 7/20818 361/700 |
| 2013/0186601 A1 | 7/2013 | Monson et al. | |
| 2013/0343002 A1 | 12/2013 | Kim et al. | |
| 2014/0376189 A1 | 12/2014 | Sakaguchi | |
| 2015/0253823 A1 | 9/2015 | Han | |
| 2016/0088769 A1 | 3/2016 | Hsiao | |
| 2016/0095197 A1 | 3/2016 | Lee | |
| 2016/0330873 A1 * | 11/2016 | Farshchian | H05K 7/20809 |
| 2017/0314871 A1 | 11/2017 | Basu et al. | |
| 2017/0318687 A1 | 11/2017 | Basu et al. | |
| 2017/0318702 A1 | 11/2017 | Basu et al. | |

FOREIGN PATENT DOCUMENTS

| | | |
|---|---|---|
| JP | 2003110273 | 4/2003 |
| JP | 2010079403 | 4/2010 |
| JP | 2011155055 | 8/2011 |
| JP | 2012529759 | 11/2012 |
| KR | 20050117482 | 12/2005 |
| WO | 2016004531 | 1/2016 |

OTHER PUBLICATIONS

United States Patent and Trademark Office, "Non-Final Office action," issued in connection with U.S. Appl. No. 15/392,589, dated Jun. 12, 2019, 52 pages.

United States Patent and Trademark Office, "Advisory Action," issued in connection with U.S. Appl. No. 15/392,589, dated Dec. 20, 2019, 6 pages.

(56) References Cited

OTHER PUBLICATIONS

United States Patent and Trademark Office, "Notice to the applicant regarding a non-complaint amendment," issued in connection with U.S. Appl. No. 15/393,251, dated Oct. 21, 2019, 4 pages.
International Searching Authority, "International Search Report", issued in connection with PCT patent application No. PCT/US2017/025109, dated May 31, 2017, 5 pages.
International Searching Authority, "Written Opinion", issued in connection with PCT patent application No. PCT/US2017/025109, dated May 31, 2017, 6 pages.
United States Patent and Trademark Office, "Final Office action," issued in connection with U.S. Appl. No. 15/392,589, dated Oct. 11, 2019, 29 pages.
United States Patent and Trademark Office, "Non-Final Office action," issued in connection with U.S. Appl. No. 15/393,251, dated Sep. 26, 2018, 14 pages.
United States Patent and Trademark Office, "Notice of Allowance," mailed in connection with U.S. Appl. No. 15/393,263, dated Oct. 25, 2018, 15 pages.
United States Patent and Trademark Office, "Notice of Allowance," issued in connection with U.S. Appl. No. 15/392,589, dated Feb. 18, 2020, 12 pages.
United States Patent and Trademark Office, Final Office action, issue in connection with U.S. Appl. No. 15/393,251, dated Feb. 12, 2020, 17 pages.
International Searching Authority, "International Preliminary Report on Patentability," issued in connection with PCT Patent Application No. PCT/US2017/025100, dated Oct. 30, 2018, 7 pages.
International Searching Authority, "International Preliminary Report on Patentability," issued in connection with PCT Patent Application No. PCT/US2017/025120, dated Oct. 30, 2018, 9 pages.
International Searching Authority, "International Preliminary Report on Patentability," issued in connection with PCT Patent Application No. PCT/US2017/025088, dated Oct. 30, 2018, 7 pages.
International Searching Authority, "International Preliminary Report on Patentability," issued in connection with PCT Patent Application No. PCT/US2017/025096, dated Oct. 30, 2018, 6 pages.
International Searching Authority, "International Preliminary Report on Patentability," issued in connection with PCT Patent Application No. PCT/US2017/025109, dated Oct. 30, 2018, 7 pages.
International Searching Authority, "International Search Report," issued in connection with PCT Patent Application No. PCT/US2017/025088, dated May 31, 2017, 3 pages.
International Searching Authority, "Written Opinion," issued in connection with PCT Patent Application No. PCT/US2017/025088, dated May 31, 2017, 6 pages.
United States Patent and Trademark Office, "Non-Final Office Action," issued in connection with U.S. Appl. No. 15/393,263, dated Apr. 3, 2018, 18 pages.
International Searching Authority, "Written Opinion", issued in connection with PCT patent application No. PCT/US2017/025120, dated Jun. 20, 2017, 8 pages.
International Searching Authority, "Search Report", issued in connection with PCT patent application No. PCT/US2017/025120, dated Jun. 20, 2017, 3 pages.
International Searching Authority, "International Search Report", issued in connection with PCT patent application No. PCT/US2017/025100, dated Jun. 16, 2017, 5 pages.
International Searching Authority, "Written Opinion", issued in connection with PCT patent application No. PCT/US2017/025100, dated Jun. 16, 2017, 6 pages.
United States Patent and Trademark Office, "Notice of Allowance", issued in connection with U.S. Appl. No. 15/393,263, dated Nov. 8, 2017,16 pages.
International Searching Authority, "Search Report", issued in connection with PCT patent application No. PCT/US2017/025096, dated May 31, 2017, 3 pages.
International Searching Authority, "Written Opinion", issued in connection with PCT patent application No. PCT/US2017/025096, dated May 31, 2017, 3 pages.
United States Patent and Trademark Office, "Advisory Action," issued in connection with U.S. Appl. No. 15/393,251, dated Mar. 22, 2019, 2 pages.
United States Patent and Trademark Office, "Non-Final Office action," issued in connection with U.S. Appl. No. 15/393,251, dated Apr. 4, 2019, 15 pages.
United States Patent and Trademark Office, "Advisory action", issued in connection with U.S. Appl. No. 15/393,251 dated Apr. 17, 2020, 8 pages.

\* cited by examiner

Operating temperature ranges of various working fluids
(Logarithmic temperature scale)

Process Logic For Providing and Using a Wickless Capillary Driven Constrained Vapor Bubble Heat Pipe for Application in Rack Servers
-1100-

Fabricate a base structure from a material with highly heat conductive properties.
-1110-

Fabricate a rack column containing a constrained vapor bubble (CVB) cell cluster including a plurality of cells, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between an evaporator region and a condenser region.
-1120-

Support a heat-generating device with the rack column at a first end in an evaporator region wherein the heat-generating device is in thermal contact with the first end of the rack column.
-1130-

Use the base structure to support the rack column at a second end in a condenser region to enable thermal transfer between the heat-generating device and the base structure via the rack column.
-1140-

End

FIG. 26

WICKLESS CAPILLARY DRIVEN CONSTRAINED VAPOR BUBBLE HEAT PIPES FOR APPLICATION IN RACK SERVERS

PRIORITY PATENT APPLICATION

This is a non-provisional patent application claiming priority to U.S. provisional patent application, Ser. No. 62/329,359; filed Apr. 29, 2016. This non-provisional patent application draws priority from the referenced provisional patent application. The entire disclosure of the referenced patent application is considered part of the disclosure of the present application and is hereby incorporated by reference herein in its entirety.

TECHNICAL FIELD

This patent application relates to electronic systems and devices, mobile devices, and the fabrication and thermal dissipation of such devices and systems, according to various example embodiments, and more specifically to a system and method for providing and using wickless capillary driven constrained vapor bubble heat pipes for application in rack servers.

BACKGROUND

Modern electric or electronic devices include many components that generate heat, including, but not limited to processors/controllers, signal processing devices, memory devices, communication/transceiver devices, power generation devices, and the like. Adequate thermal management of these components is critical to the successful operation of these systems and devices. When components generate a large amount of heat, the heat must be dissipated or transported quickly away from the heat source in order to prevent failure of the heat producing components.

In the past, thermal management of electronic components has included air-cooling systems and liquid-cooling systems. Regardless of the type of fluid used (e.g., air or liquid), it may be challenging to deliver the fluid to the heat source, e.g., the component generating large amounts of heat. For example, electronic devices, such as mobile devices or wearables, may include processors and/or integrated circuits within enclosures that make it difficult for a cooling fluid to reach the heat generating components.

To transfer the heat away from these difficult to access components, conventional solutions use plates made from highly thermally-conductive material, such as graphite or metal, that have been placed in thermal contact with the heat generating components such that the heat is carried away via conduction through the plate. However, the speed and efficiency of the heat transport in a solid plate is limited by the thermal resistance of the material.

Conventional solutions also use wicked heat pipes to transfer heat from a heated region (also referred to as an evaporator region) to a cooled region (also referred to as a condenser region). A traditional wicked heat pipe consists of a tube with a wick running along the interior surface of the tube. The tube is filled with a liquid that evaporates into a vapor at the evaporator region, which then flows toward the condenser region. The vapor condenses back into a liquid at the condenser region. The wick enables the condensed liquid to flow back to the evaporator region for the cycle to repeat.

However, there are many challenges with wicked or grooved structures in integrated vapor chambers or liquid cooled heat pipes on standard Printed Circuit Boards (PCBs), for example. A few of these disadvantages with conventional wicked or grooved structures are summarized below:

Micro-grooved structures showed poor performance in gravity operations;

Lack of fluid crossover ability causes circulation challenges;

The wicks cause a thermal resistance inside the pipe itself;

Insertion of a wick structure (regardless of porosity and design) is a challenge and not a common practice for PCB manufacturers;

Insertable wick requires an additional copper restraint to hold it in place to allow for a cavity for vapor;

The inside of vapor chambers and heat pipes is usually coated in sintered metal, which creates problems. The basic problem is that the inside of both the vapor chamber and the heat pipe have very little surface area.

Traditional rack servers are cooled using complex connections of chillers, compressors, and air handlers in the computing or data storage environment. Some rack server cooling solutions use air-cooled or liquid-cooled solutions. A flow of air or liquid is typically directed through each server rack and/or housing to remove the excess heat from each server in the rack. However, conventional rack servers generate a significant amount of excess heat. The dissipation of this excess heat consumes a significant level of power. Conventional rack server cooling solutions have been unable to sufficiently reduce the power demands of the rack server cooling system.

BRIEF DESCRIPTION OF THE DRAWINGS

The various embodiments are illustrated by way of example, and not by way of limitation, in the figures of the accompanying drawings in which:

FIG. 26 is a process flow chart illustrating an example embodiment of a method as described herein.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

Figure 1:
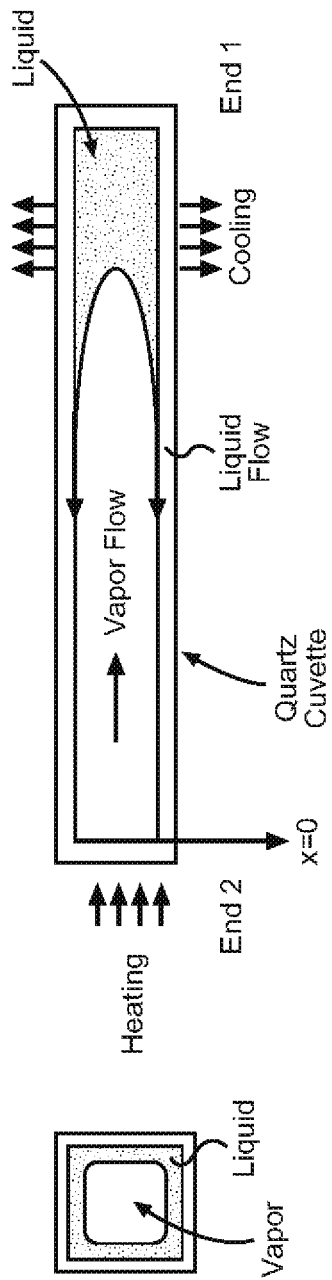
FIG. 1 illustrates an example embodiment of the wickless capillary driven constrained vapor bubble (CVB) heat pipe as disclosed herein.

In the various embodiments described herein, a system and method for providing and using a wickless capillary driven constrained vapor bubble (CVB) heat pipe are disclosed. FIG. 1 illustrates an example embodiment of the wickless capillary driven CVB heat pipe as disclosed herein. The various example embodiments disclosed herein provide a variety of advantages over conventional solutions. For example, the wickless CVB heat pipe of the various example embodiments disclosed herein:

- Leads to simpler and lighter systems;
- Can be used for space and electronic cooling applications;
- Is effective as the dimension of the cavity can be reduced and the heat pipe can become a micro heat pipe;
- Is easier to manufacture by PCB manufacturers or other device fabricators, as there are no wick structures to insert or adhere to the walls of the heat pipe;
- Does not require moving parts; and
- Capillary forces in the corners of the channels drive the liquid to the evaporator. As a result, there are no challenges because of wicks or grooved structures as described above. Circular or rounded corner channels do not provide this advantage.

Figure 2:
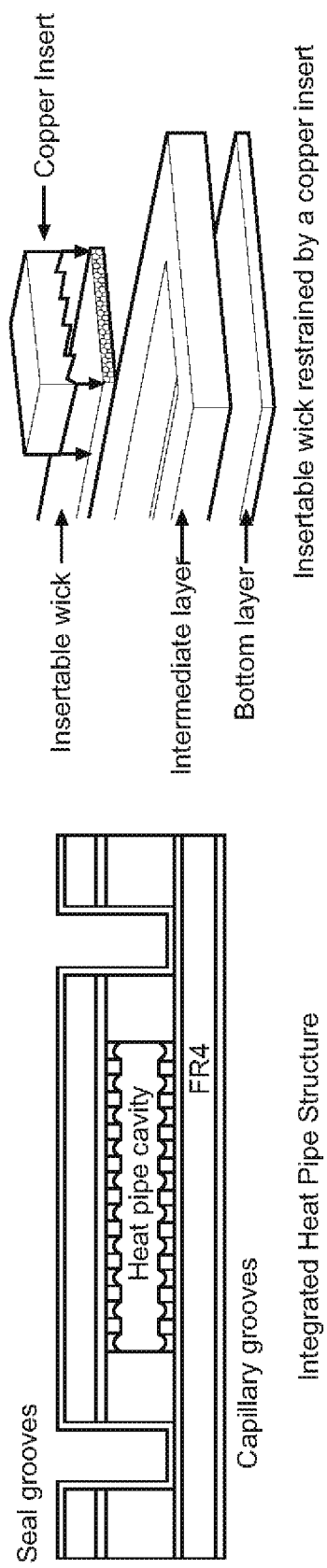
FIGS. 2 and 3 illustrate some of the disadvantages of the conventional wicked or grooved heat pipe structures.
Figure 3:
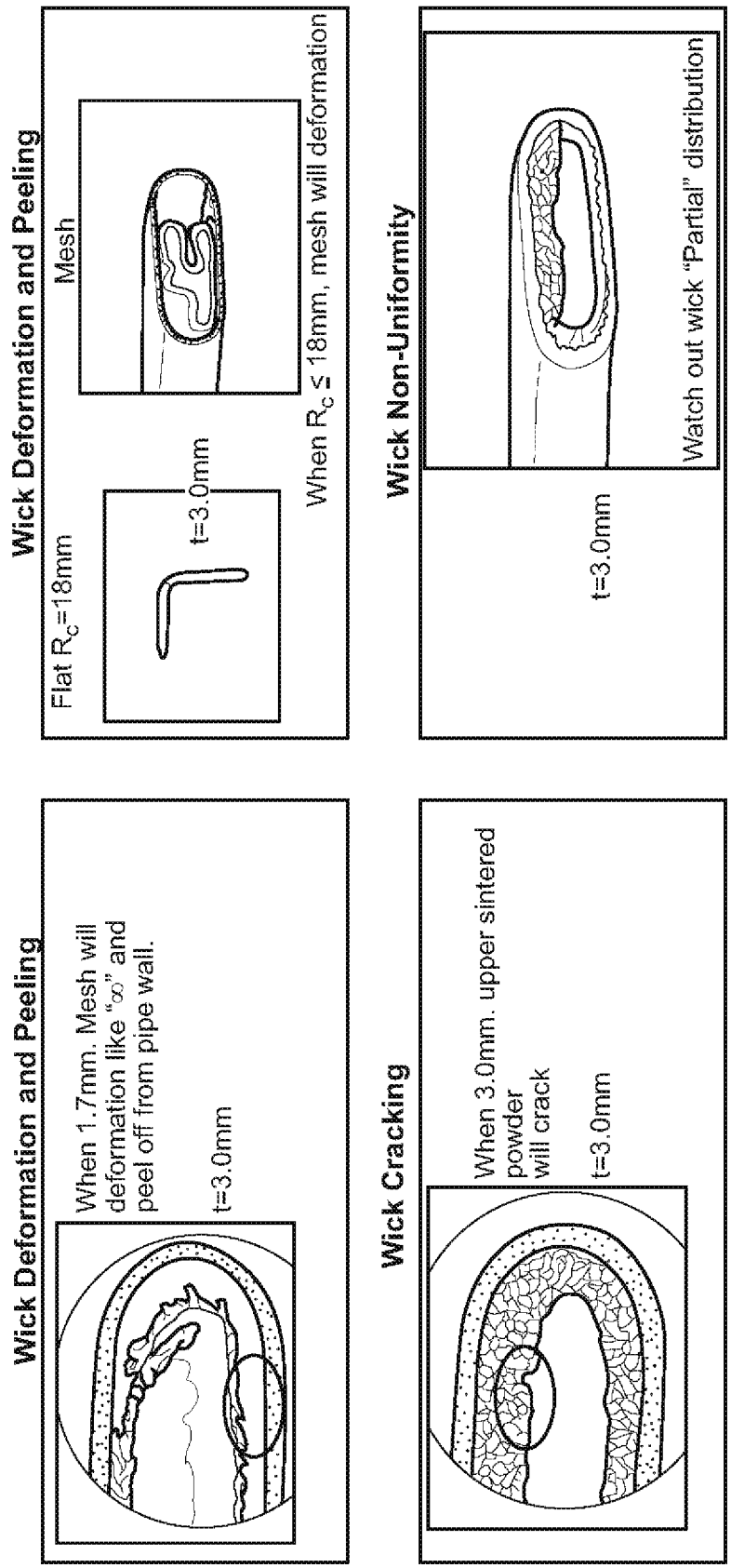

FIGS. 2 and 3 illustrate some of the disadvantages of the conventional wicked or grooved heat pipe structures. A few of these disadvantages with conventional wicked or grooved structures are summarized below:

- Micro-grooved structures showed poor performance in gravity operations;
- Lack of fluid crossover ability causes circulation challenges;
- The wicks cause a thermal resistance inside the pipe itself;
- Insertion of a wick structure (regardless of porosity and design) is a challenge and not a common practice for PCB manufacturers;
- Insertable wicks require an additional copper restraint to hold it in place to allow a cavity for vapor;
- The insides of the vapor chambers and the heat pipes are usually coated in sintered metal, which creates problems. The basic problem is that the inside of both the vapor chamber and the heat pipe have very little surface area; and
- Wicked heat pipes have a tendency to experience "dry-out," whereby the liquid in the evaporator region is fully vaporized and the wick becomes void of liquid.

Figure 4A:
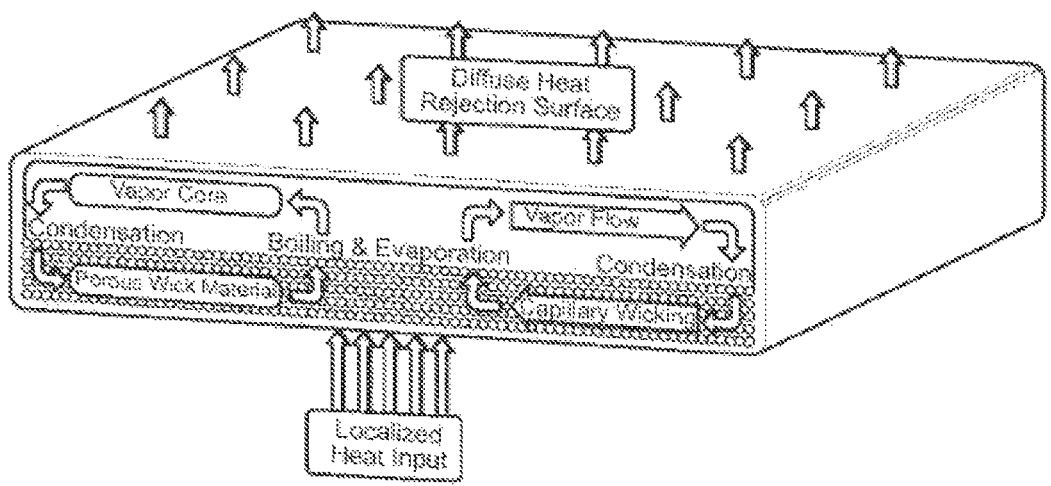
FIG. 4A illustrates an example of nucleate boiling in porous wick structures.

FIG. 4A illustrates an example of nucleate boiling in porous wick structures. Conventional wisdom calls for nucleate boiling to be avoided in wicked heat pipes having longitudinal groove wick structures. In these wicks, nucleation of vapor bubbles completely obstructs the non-communicating individual paths of capillary liquid return to the evaporator section; a boiling limit is imposed in this case based on the conventional nucleation incipience superheat criterion. Alternatively, sintered screen mesh, sintered powder, and fibrous wick structures affixed to the wall of a heat pipe can continue to feed liquid to the heat source during boiling via the inherently stochastic network of interconnected pores. The various embodiments disclosed herein avoid these problems inherent in wicked heat pipes.

The table below provides a comparison between wicked and wickless heat pipes.

|  | Wick-type heat pipes | Wickless (CVB) heat pipes |
| --- | --- | --- |
| Manufacturing | The fabrication consists of added steps and complexity due to the varied nature of the wicks and inserts needed to keep them in place (adhered to the wall of the pipe). | These are much simpler to fabricate as there are no wick structures to insert or adhere to the walls of the heat pipe. |
| Performance | The performance can be better than the wickless type as it can avoid dry out for longer heat loads with aided capillary flow to the heated end. The combination of the wick structure and material would determine performance. | Performance could be hindered on high heat loads if capillary pumping head drops off (too long of a bubble). The size of the Constrained Vapor Bubble would drive the performance and when compared to a |

-continued

| | Wick-type heat pipes | Wickless (CVB) heat pipes |
|---|---|---|
| | | similar sized wick type pipe, the ease of manufacturability and longevity of this type of heat pipe wins. |
| Simplicity | Wick structure and material of the wick can be complex and tough to maintain. Wicks add to cost of the device. | Lack of a material wick makes this simpler and lighter to use. Also, less expensive to build. |
| Challenges | Longevity of wicks is a challenge, cost incurred due to addition of a wick is another challenge. PCB manufacturers do not have a standard process for inserting the wicks. Nucleate boiling within wick structure creates problems. | Long dry-out lengths at high heat loads for large bubble sizes creates challenges. Maintaining symmetry of capillary flow in a horizontal direction on Earth could be an issue. |

Figure 4B:
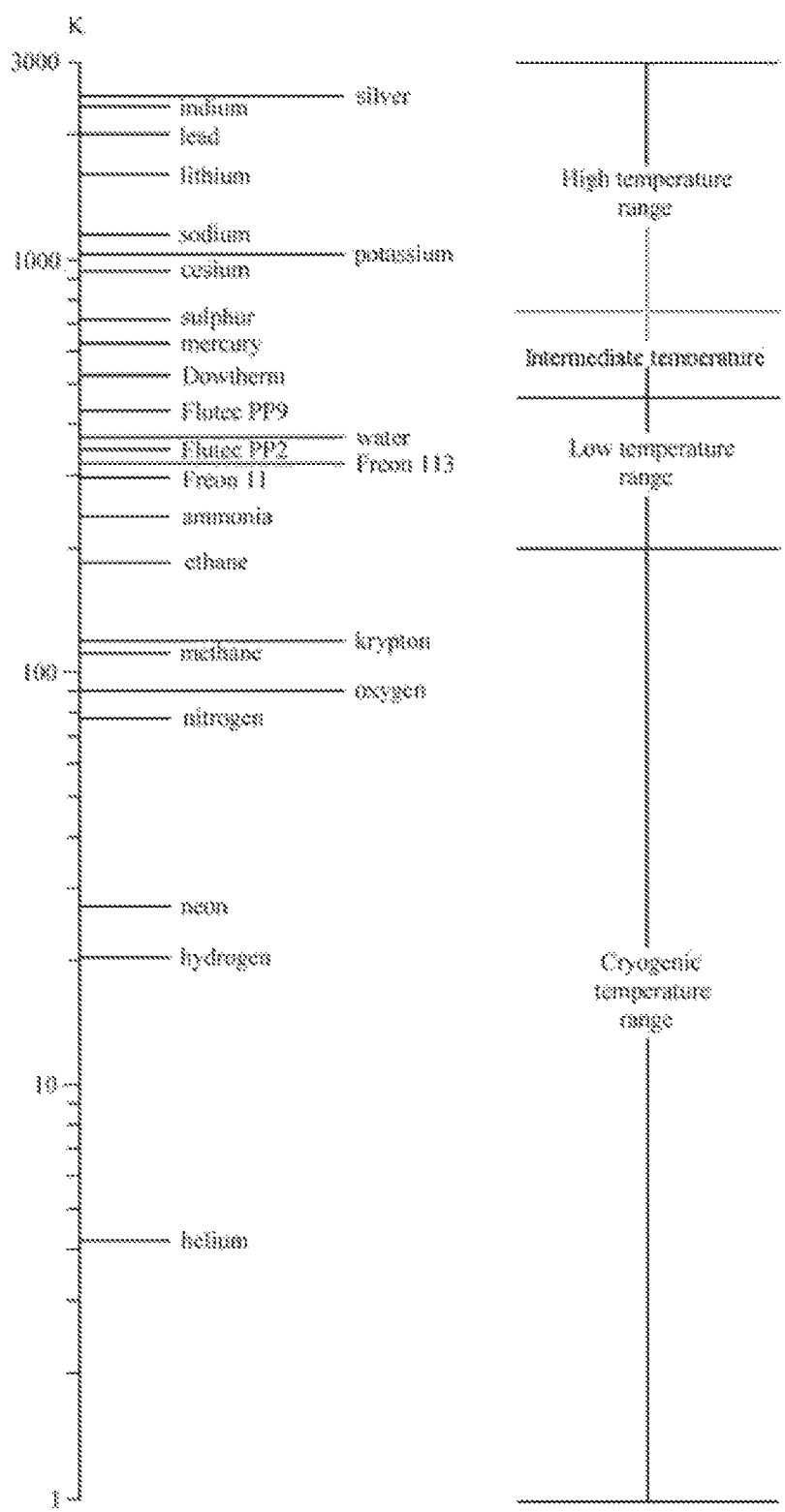
FIG. 4B illustrates a logarithmic temperature scale of operating temperature ranges of different working fluids.

The tables below and the logarithmic scale shown in FIG. 4B provide a summary of fluid possibilities and material compatibility for various operating temperature ranges for the CVB wickless heat pipes of example embodiments.

TABLE 1

Working fluids and temperature ranges of heat pipes

| Working Fluid | Melting Point, K at 1 atm | Boiling Point, K at 1 atm | Useful Range, K |
|---|---|---|---|
| Helium | 1.0 | 4.21 | 2-4 |
| Hydrogen | 13.8 | 20.38 | 14-31 |
| Neon | 24.4 | 27.09 | 27-37 |
| Nitrogen | 63.1 | 77.35 | 70-103 |
| Argon | 83.9 | 87.29 | 84-116 |
| Oxygen | 54.7 | 90.18 | 73-119 |
| Methane | 90.6 | 111.4 | 91-150 |
| Krypton | 115.3 | 119.7 | 116-160 |
| Ethane | 89.9 | 184.6 | 150-240 |
| Freon 22 | 113.1 | 232.2 | 193-297 |
| Ammonia | 195.5 | 239.9 | 213-373 |
| Freon 21 | 138.1 | 282.0 | 233-360 |
| Freon 11 | 162.1 | 296.8 | 233-393 |
| Pentane | 143.1 | 309.2 | 253-393 |
| Freon 113 | 236.5 | 320.8 | 263-373 |
| Acetone | 180.0 | 329.4 | 273-393 |
| Methanol | 175.1 | 337.8 | 283-403 |
| Flutec PP2 | 223.1 | 349.1 | 283-433 |
| Ethanol | 158.7 | 351.5 | 273-403 |
| Heptane | 182.5 | 371.5 | 273-423 |
| Water | 273.1 | 373.1 | 303-550 |
| Tolueue | 178.1 | 383.7 | 323-473 |
| Flutec PP9 | 203.1 | 433.1 | 273-498 |
| Naphthalene | 353.4 | 490 | 408-623 |
| Dowtherm | 285.1 | 527.0 | 423-668 |
| Mercury | 234.2 | 630.1 | 523-923 |
| Sulphur | 385.9 | 717.8 | 530-947 |
| Cesium | 301.6 | 943.0 | 723-1173 |
| Rubidium | 312.7 | 959.2 | 800-1275 |
| Potassium | 336.4 | 1032 | 773-1273 |
| Sodium | 371.0 | 1151 | 873-1473 |
| Lithium | 453.7 | 1615 | 1273-2073 |
| Calcium | 1112 | 1762 | 1400-2100 |
| Lead | 600.6 | 2013 | 1670-2200 |
| Indium | 429.7 | 2353 | 2000-3000 |
| Silver | 1234 | 2485 | 2073-2573 |

TABLE 2

Generalized results of experimental compatibility tests

| Working Fluid | Compatible Material | Incompatible Material |
|---|---|---|
| Water | Stainless Steel[a], Copper, Silica, Nickel, Titanium | Aluminum, Inconel |
| Ammonia | Aluminum, Stainless Steel, Cold Rolled Steel, Iron, Nickel | |
| Methanol | Stainless Steel, Iron, Copper, Brass, Silica, Nickel | Aluminum |
| Acetone | Aluminum, Stainless Steel, Copper, Brass, Silica | |
| Freon-11 | Aluminum | |
| Freon-21 | Aluminum, Iron | |
| Freon-113 | Aluminum | |
| Heptane | Aluminum | |
| Dowtherm | Stainless Steel, Copper, Silica | |
| Lithium | Tungsten, Tantalum, Molybdenum, Niobium | Stainless Steel, Nickel, Inconel, Titanium |
| Sodium | Stainless Steel, Nickel, Inconel, Niobium | Titanium |
| Cesium | Titanium, Niobium, Stainless Steel, Nickel-based superalloys | |
| Mercury | Stainless Steel[b] | Molybdenum, Nickel, Tantalum, Inconel, Titanium, Niobium |
| Lead | Tungsten, Tantalum | Stainless Steel, Nickel, Inconel, Titanium, Niobium |
| Silver | Tungsten, Tantalum | Rhenium |

[a]Sensitive to cleaning; [b]with Austenitic SS

Figure 5:
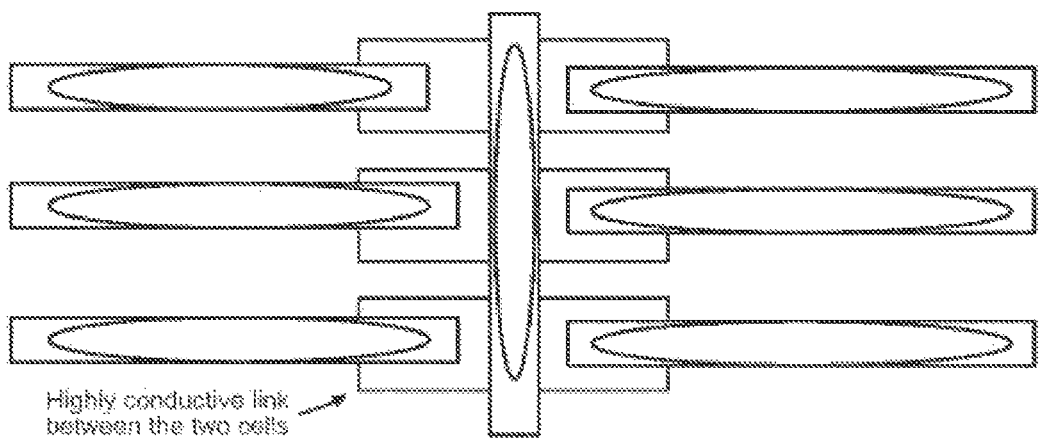
FIG. 5 illustrates some of the techniques with which the embodiments described herein overcome some of the challenges.

FIG. 5 illustrates some of the techniques with which the embodiments described herein overcome some of the challenges. In some circumstances, the wickless CVB heat pipe can also encounter some implementation issues. In particular, a lack of wettability of liquid to the surface, a high heat load, and opposing gravity can cause longer dry out lengths where the liquid loses contact with the wall and degrades the CVB's performance. However, the embodiments described herein overcome these challenges in a variety of ways including by use of one or more of the techniques listed below and shown in FIG. 5:

Array (daisy chaining) of shorter CVB cells can be used to increase the total CVB length. In this embodiment, the condenser for one cell acts as the evaporator of an adjacent cell;

Cross patterns of CVB arrays can make them work in any gravity orientation;

Using a highly wettable liquid with a high energy surface can decrease dry outs; and Micro-sized piezo devices can be used to help increase capillary lengths.

Figure 6:
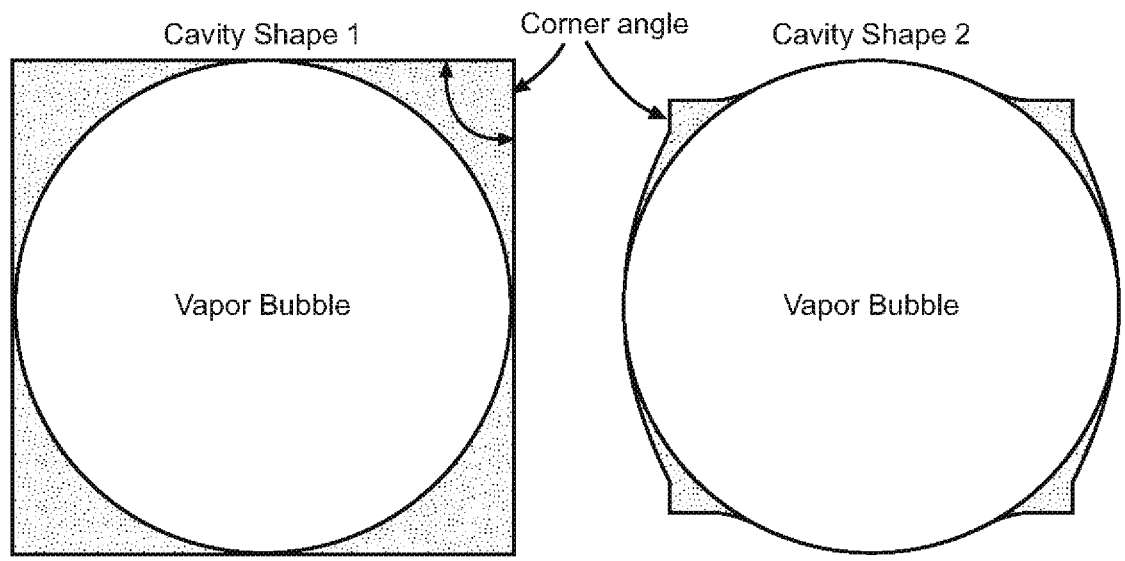
FIG. 6 illustrates example embodiments showing novel cavity shapes.

The wickless CVB heat pipe of various example embodiments is designed with regard to several important parameters as listed below:

Gravity impact
Fin effectiveness
Dry out lengths
Dimensions and shapes
Heat transfer rates
Liquid vapor interface
Surface tension
Wettability FIG. 6 illustrates example embodiments showing novel cavity shapes. Liquid rising in the capillary formed by the vapor bubble and cavity walls can be manipulated by use of various cavity shapes. Through innovative cavity shapes as shown in FIG. 6, CVB capillary lengths can be tuned for the same vapor bubble diameter. Geometries that create smaller corner angles with effectively smaller hydraulic radii can lead to larger capillary lengths. Tools can help to predict approximate capillary lengths for different corner areas, bubble diameters, contact angles, and different fluid properties. This can help to tune the cavity dimensions per the available surface dimensions and fluids in products.

Figure 7:
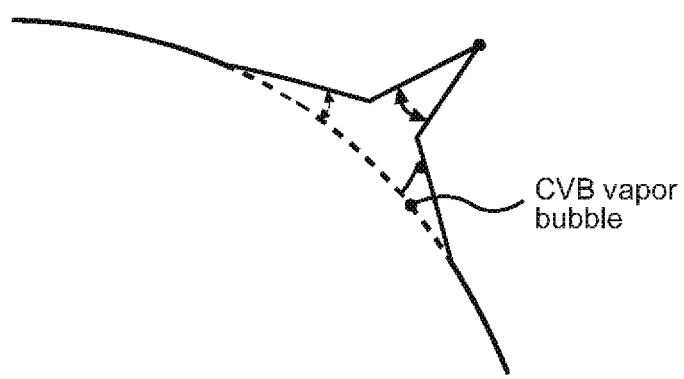
FIG. 7 illustrates an example embodiment showing the idea behind the new cavity shapes.

FIG. 7 illustrates an example embodiment showing the idea behind the new cavity shapes. The circular part of the shape maintains CVB vapor geometry. Sharper corner geometry help reduce the corner liquid interface radius. The base opening creates sharper corner angles with the vapor bubble and reduces overall hydraulic diameter.

Figure 8:
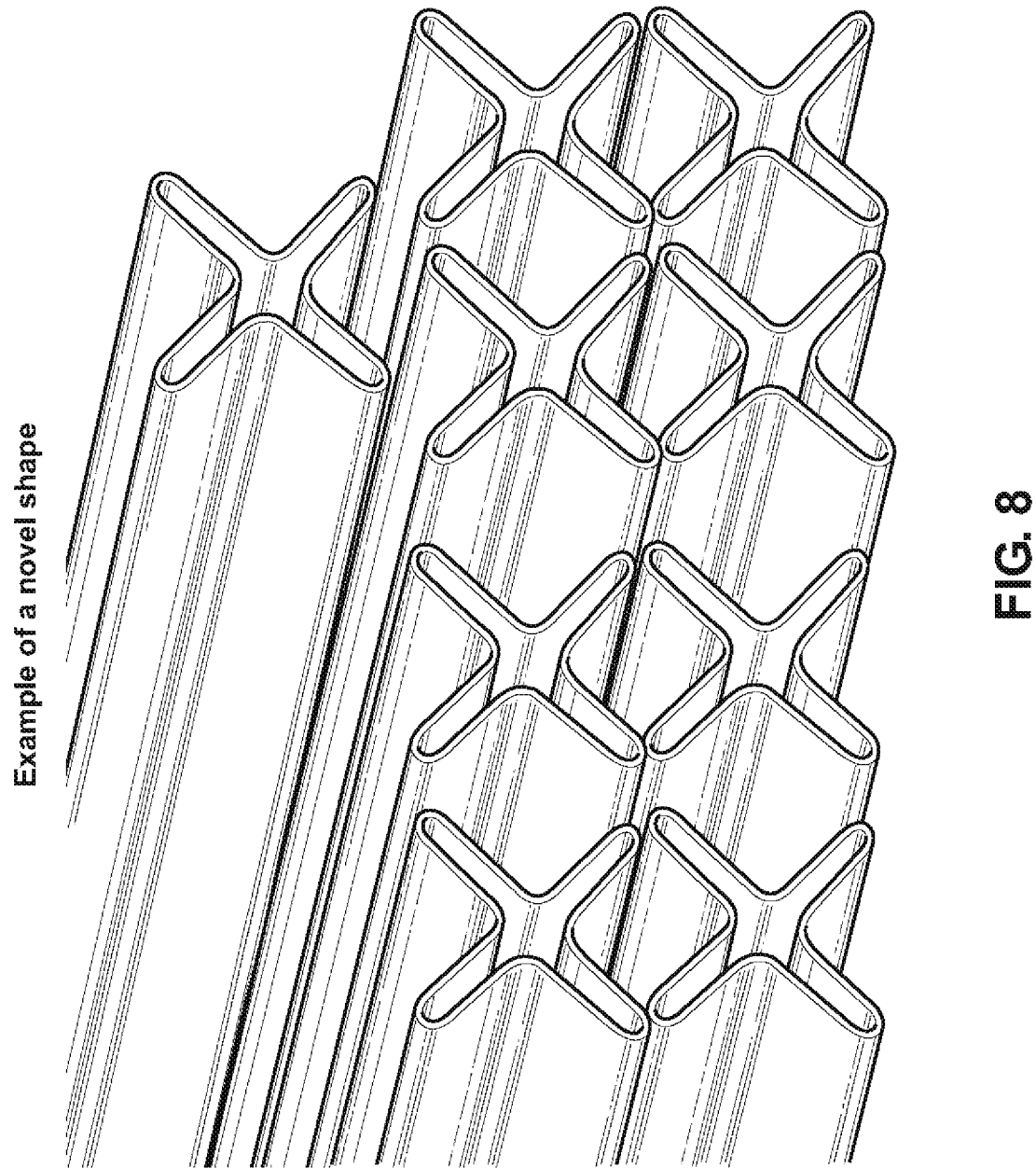
FIG. 8 illustrates an example embodiment showing the manufacturability of the new cavity shapes.

FIG. 8 illustrates an example embodiment showing the manufacturability of the new cavity shapes. In various example embodiments, non-standard/novel shapes can include flowers, octagons, stars, triangles, and the like. Most metal manufacturers can make it (as long as it's under 2" in diameter), which is ideal for micro heat pipes. Like standard shapes, the tubing is formed and welded into the "mother" round shape before it can be finalized. In the case of the x-shaped tubing as shown in FIG. 8, the tubing went from round to square, and then was formed into the "x" shape. Uncommon shapes may go through many different shaping processes to meet the client's requirements. Different techniques used include welding, laser cutting, injection molding, etc. For non-metallic tube material, one can use chemical etch or heat shaping.

Figure 9:
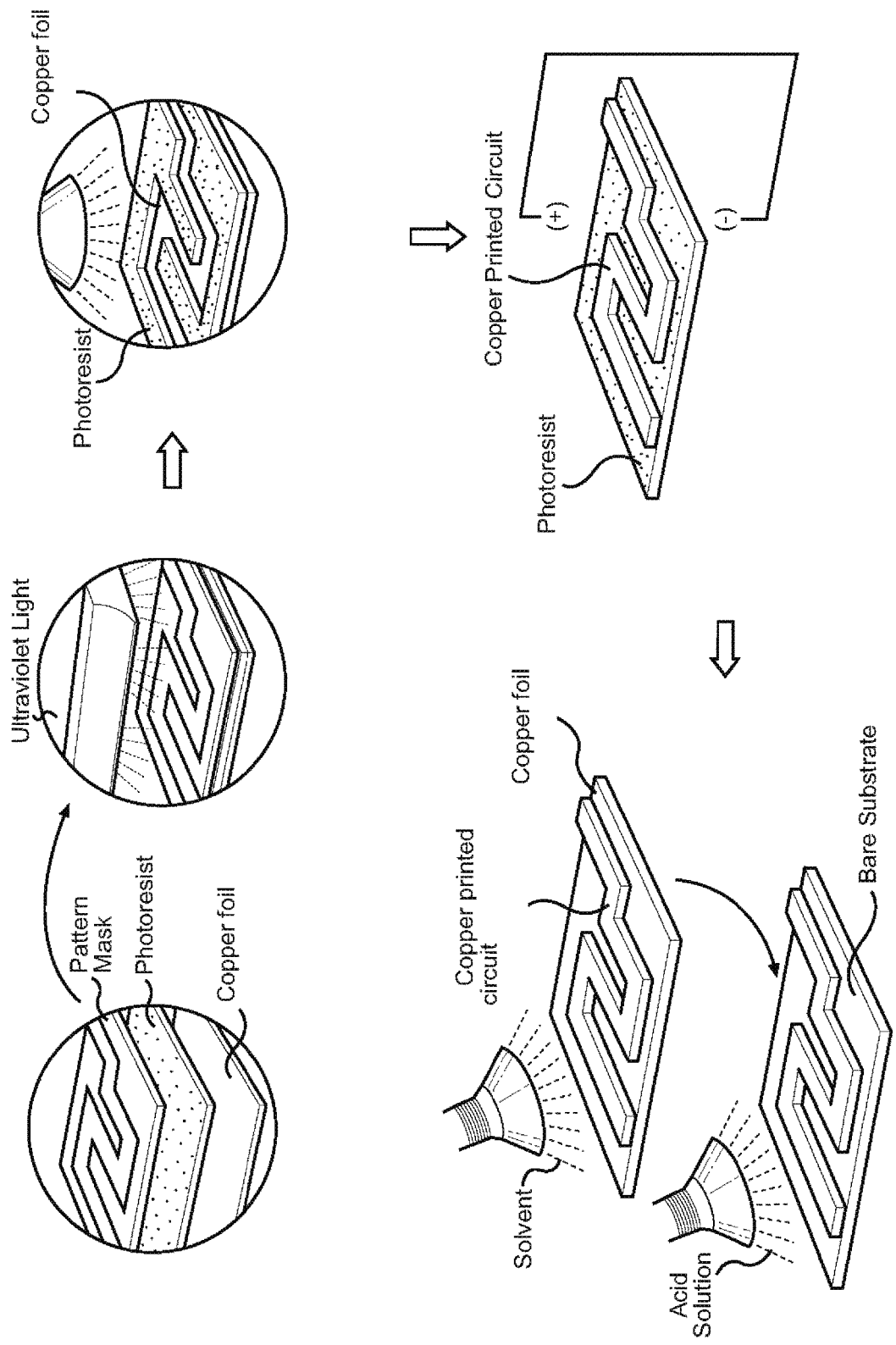
FIG. 9 illustrates a typical Printed Circuit Board (PCB) fabrication process.
Figure 10:
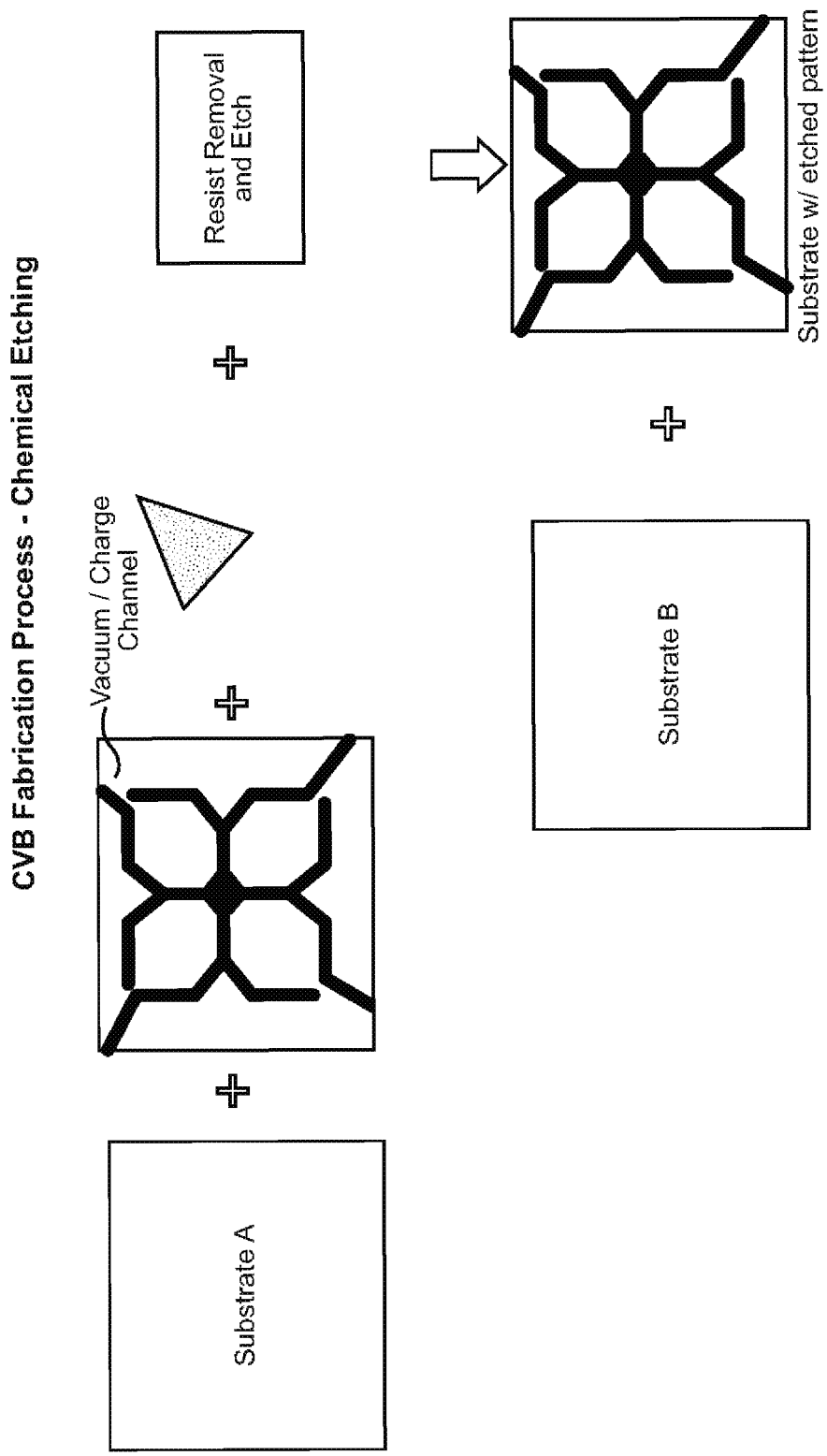
FIG. 10 illustrates an example embodiment of a CVB heat pipe fabrication process using chemical etching.
Figure 11:
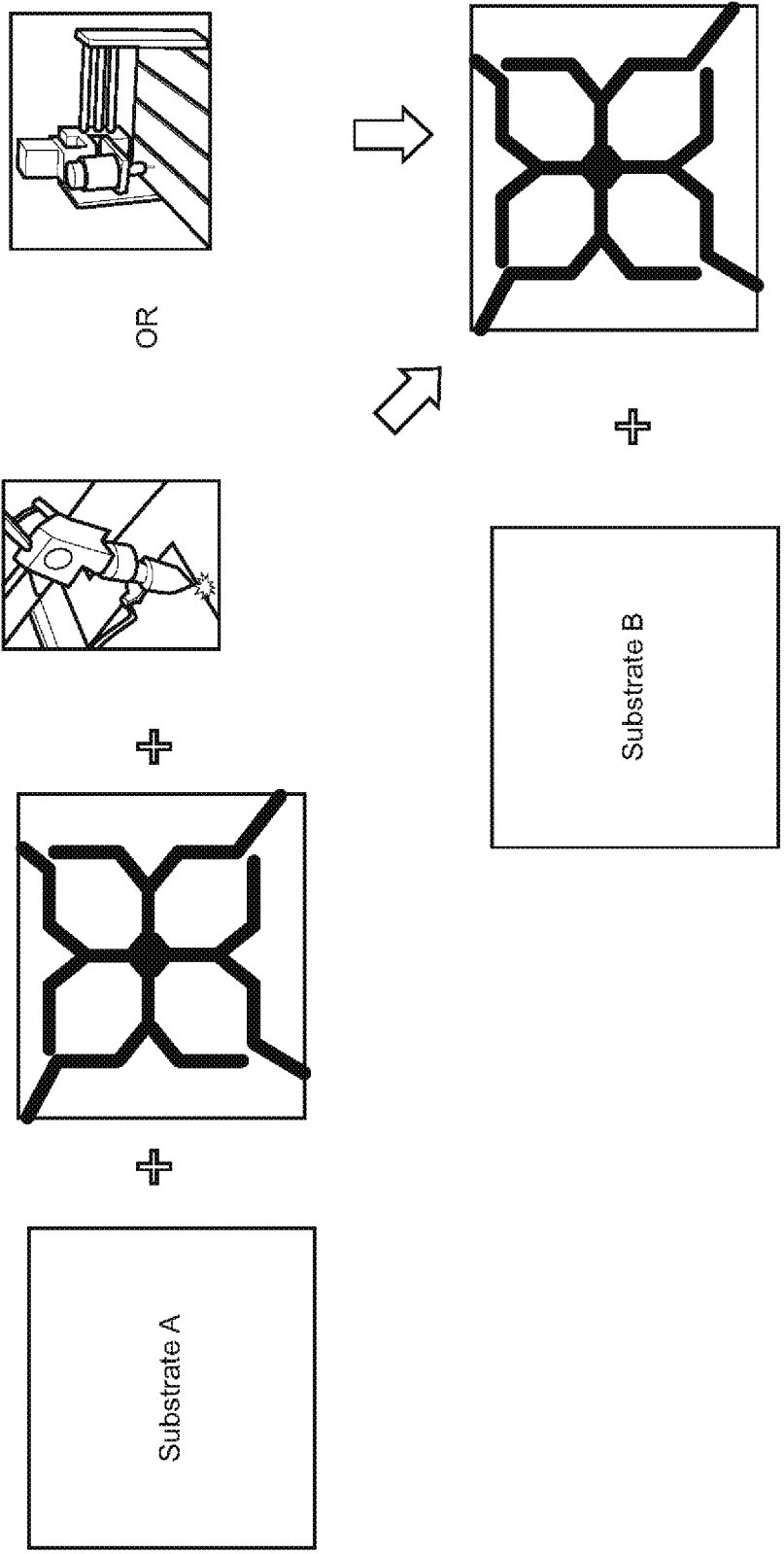
FIG. 11 illustrates an example embodiment of a CVB heat pipe fabrication process using laser/mechanical subtraction.
Figure 12:
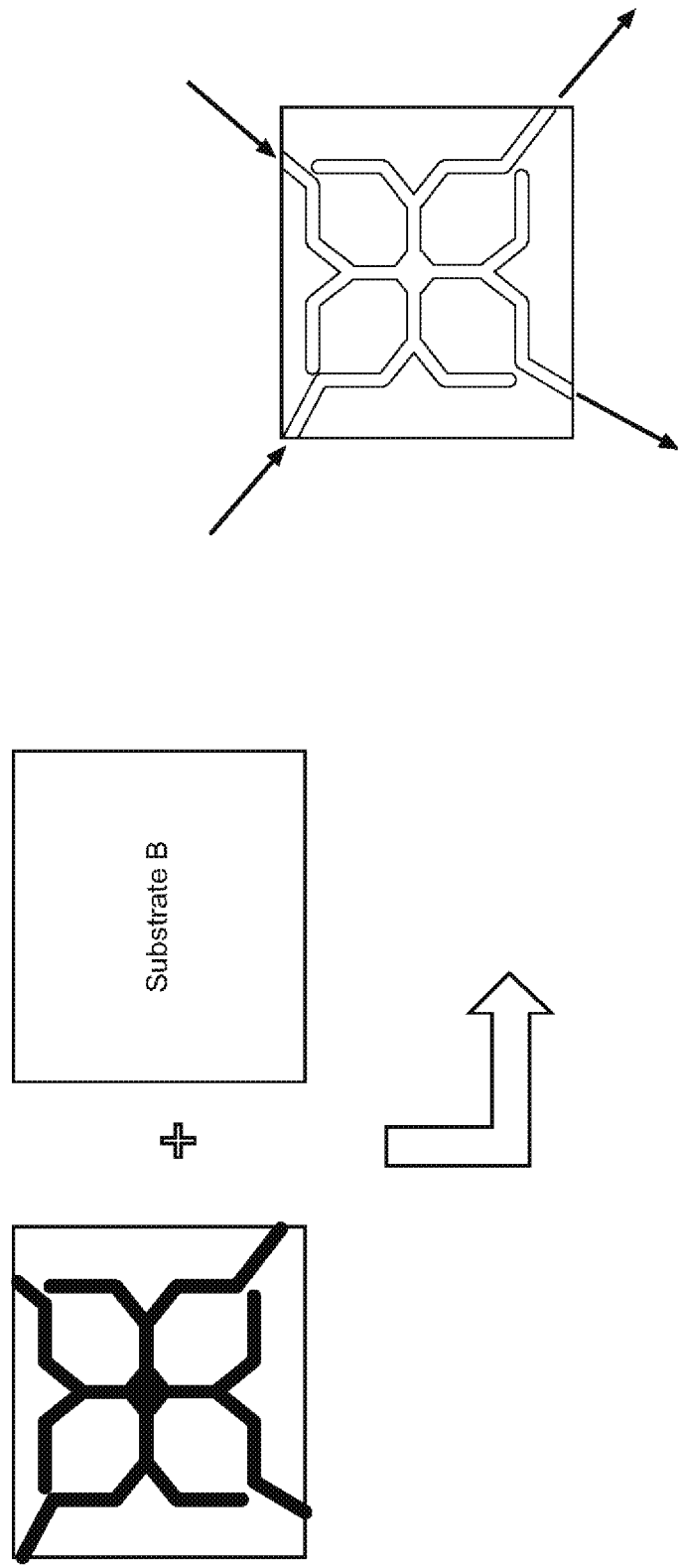
FIG. 12 illustrates an example embodiment of a CVB charging process using vacuum, fill, and seal.

FIG. 9 illustrates a typical Printed Circuit Board (PCB) fabrication process. Such processes can be modified and applied to the fabrication of CVB heat pipes. FIG. 10 illustrates an example embodiment of a CVB heat pipe fabrication process using chemical etching. In general, the CVB heat pipe fabrication process of an example embodiment is an extension of the PCB fabrication or silicon patterning process. FIG. 11 illustrates an example embodiment of a CVB heat pipe fabrication process using laser/mechanical subtraction. FIG. 12 illustrates an example embodiment of a CVB charging process using vacuum, fill, and seal.

Figure 13:
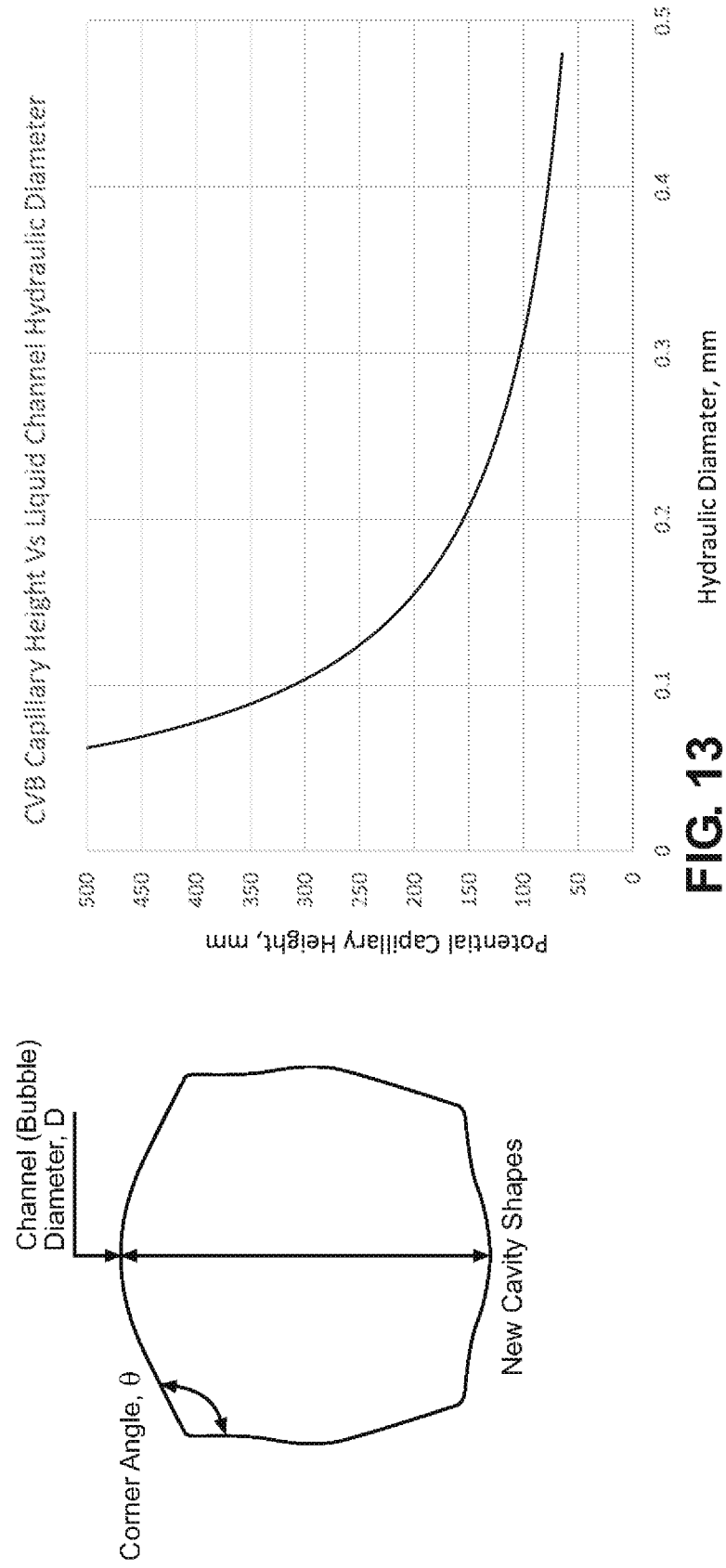
FIG. 13 illustrates an example embodiment showing capillary heights for CVB for different cavity shapes.

FIG. 13 illustrates an example embodiment showing capillary lengths for CVB heat pipes for different cavity shapes. The corner angles of the cavity can be modified and adjusted to determine a corresponding capillary length. A tool can help to predict an approximate capillary length for different corner angles, channel diameters, contact angles, and different fluid properties. This can help to tune the cavity dimensions per the available surface dimensions and fluids in products.

Figure 14:
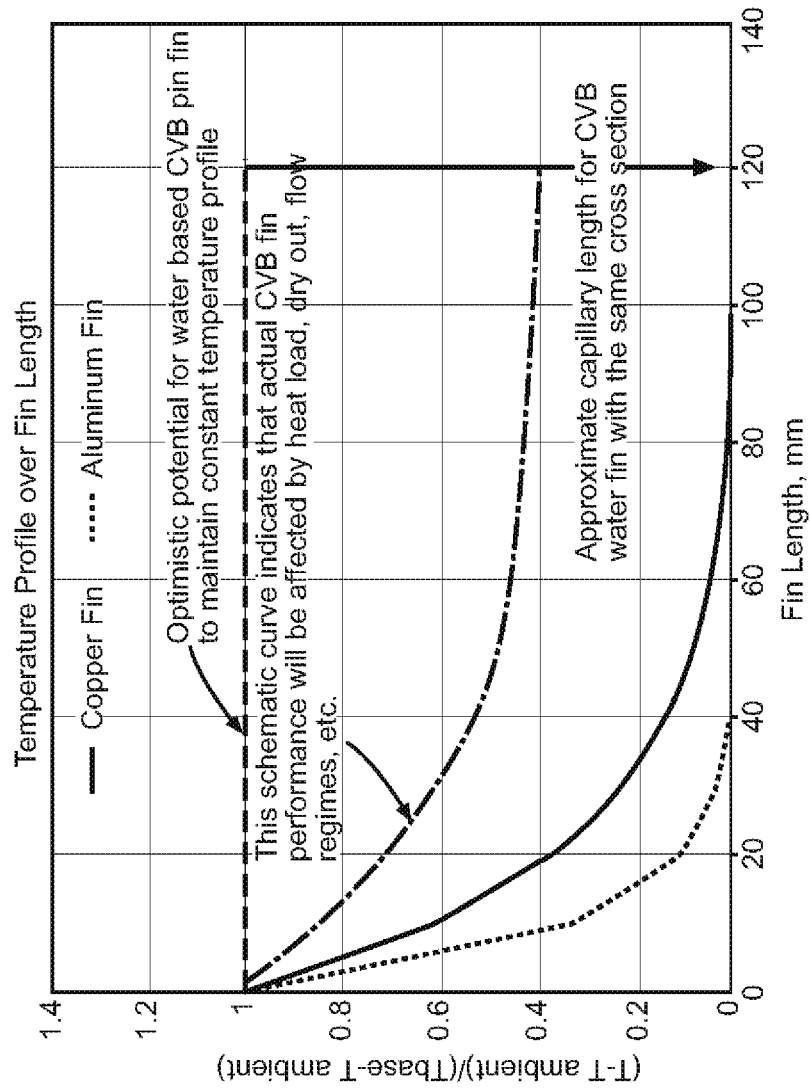
FIG. 14 illustrates a temperature comparison between a CVB fin and a metal fin.

FIG. 14 illustrates a temperature comparison between a CVB fin and a metal fin. The basic calculations show a potential for a high temperature profile for a longer length CVB fin. Higher temperatures over the fin result in higher heat transfer. This indicates the potential for taller, thinner, and efficient fins with the CVB embodiments described herein. The CVB embodiments described herein avoid dry outs and maximize two phase heat transfer for a given fin length. Heat sink based on CVB fins can be expected to be lighter as compared to non-CVB based heat sinks for similar thermal performance.

Figure 15:
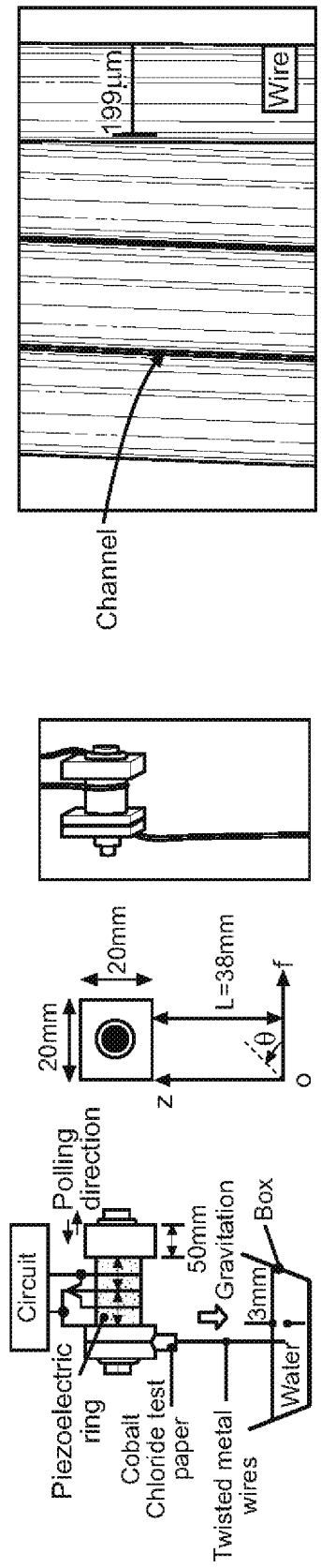
FIGS. 15 through 17 illustrate the effects of ultrasonic on capillary forces as discussed in the prior art.
Figure 16:
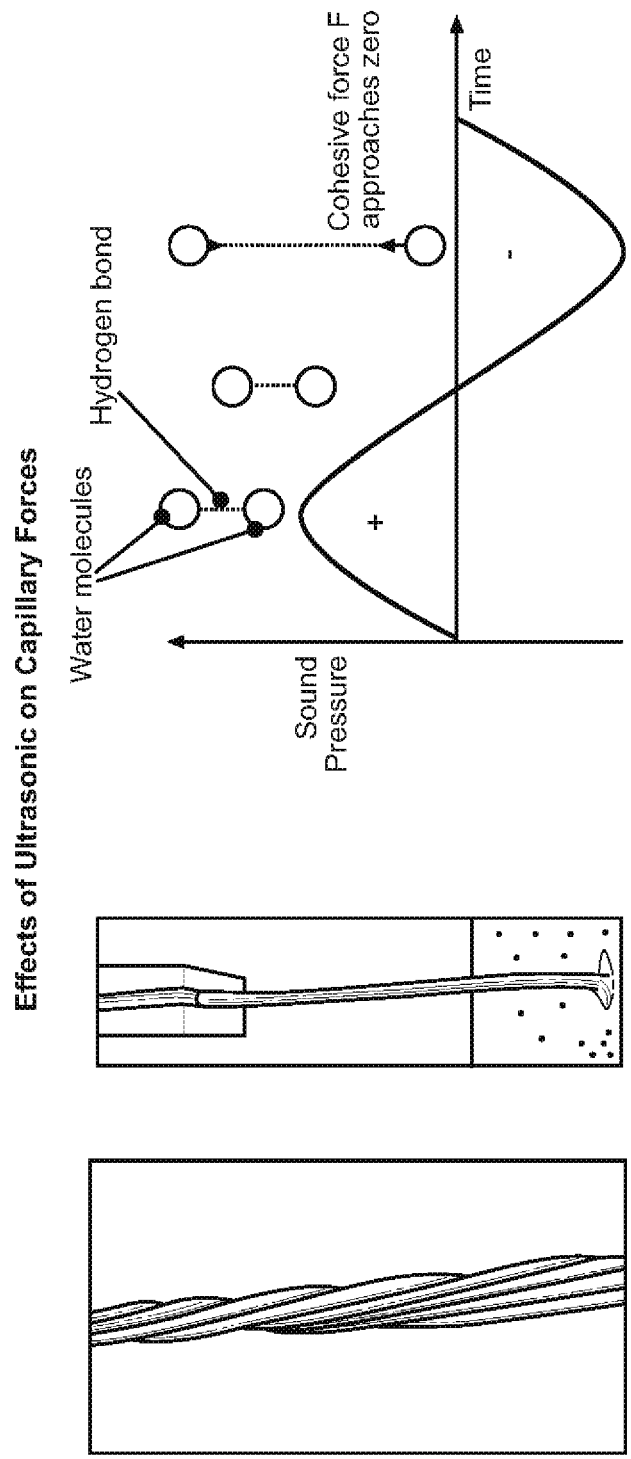
Figure 17:
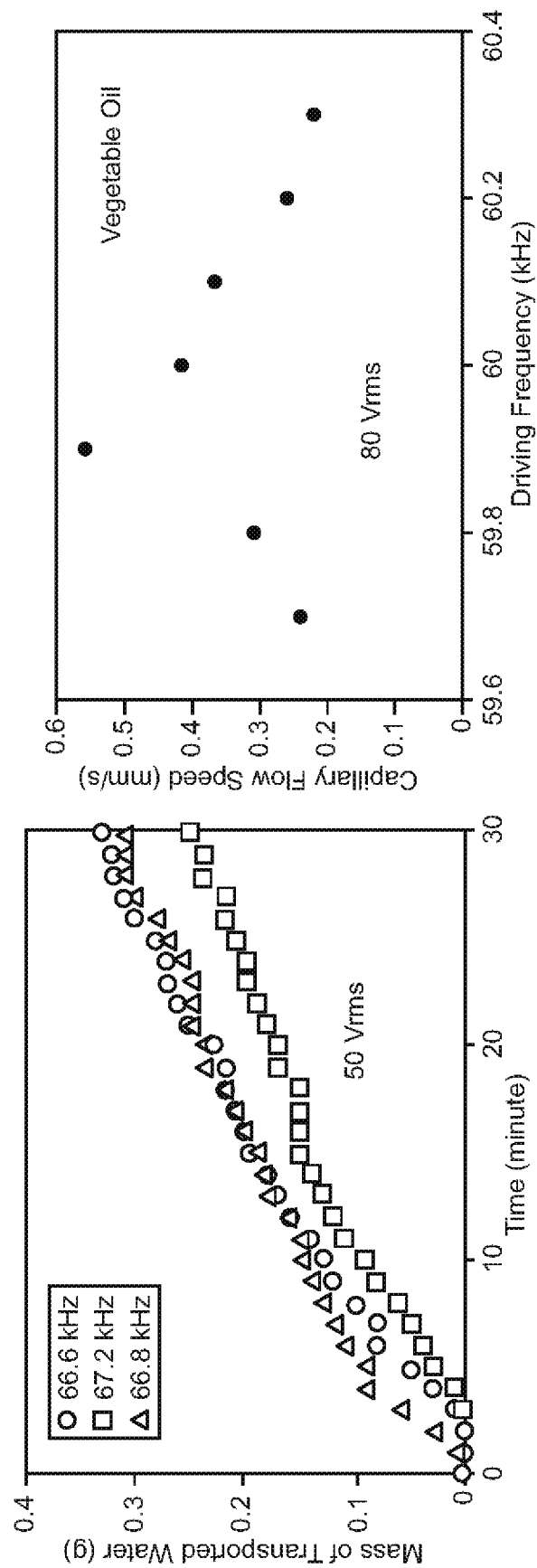

FIGS. 15 through 17 illustrate the effects of ultrasonic on capillary forces through data published in the prior art. The prior art is referenced here only to indicate that capillary force can be influenced through external means besides geometry.

Figure 18:
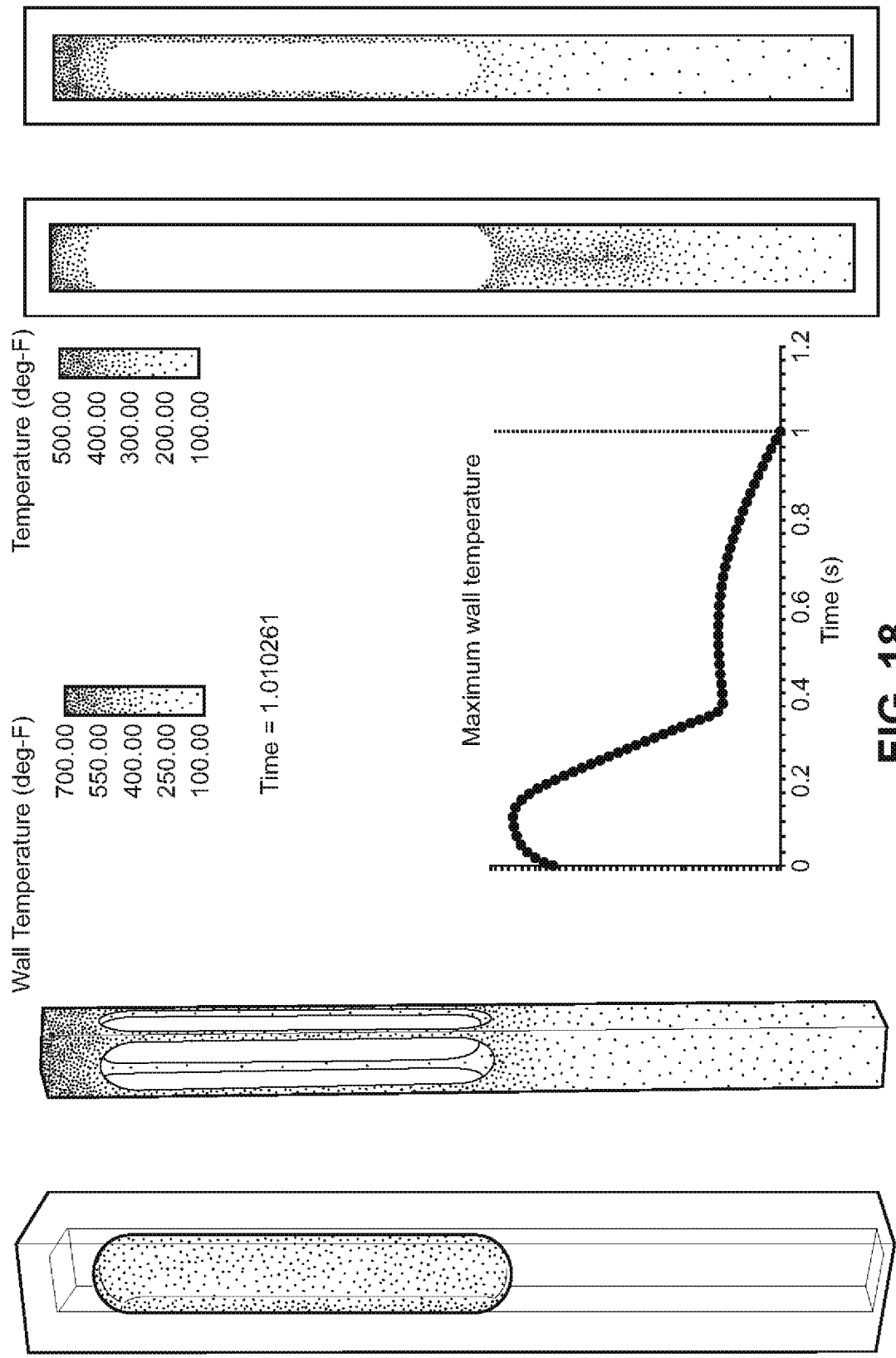
FIG. 18 illustrates the results of operation with an example embodiment as shown with a prior art simulation tool (e.g., Flow3D simulations)

FIG. 18 illustrates the results of the operation of an example embodiment as shown with a prior art simulation tool (e.g., Flow3D simulations). The Flow3D simulations show very promising thermal results and indicate how simulating this complex phenomenon can work with new and sophisticated tools. The simulation can be tuned and used to our advantage to yield sensitivity analysis.

Figure 19:
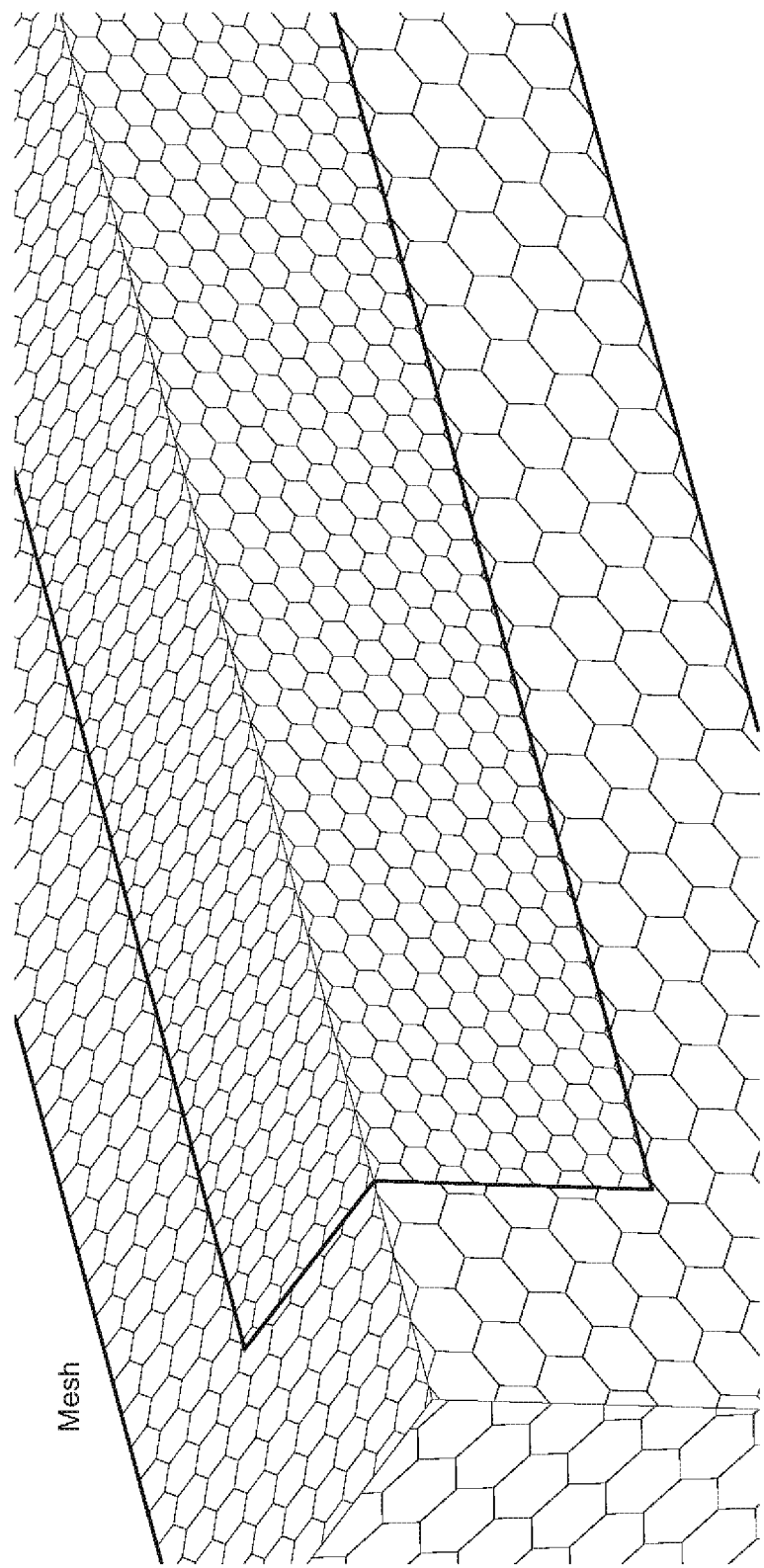
FIG. 19 illustrates an example embodiment of a three-dimensional shape embedded with a computational mesh of wickless capillary driven heat pipes, shown using a prior art simulation tool.

FIG. 19 illustrates an example embodiment of a three-dimensional shape embedded with a computational mesh of wickless capillary driven heat pipes, shown using a prior art simulation tool.

Figure 20:
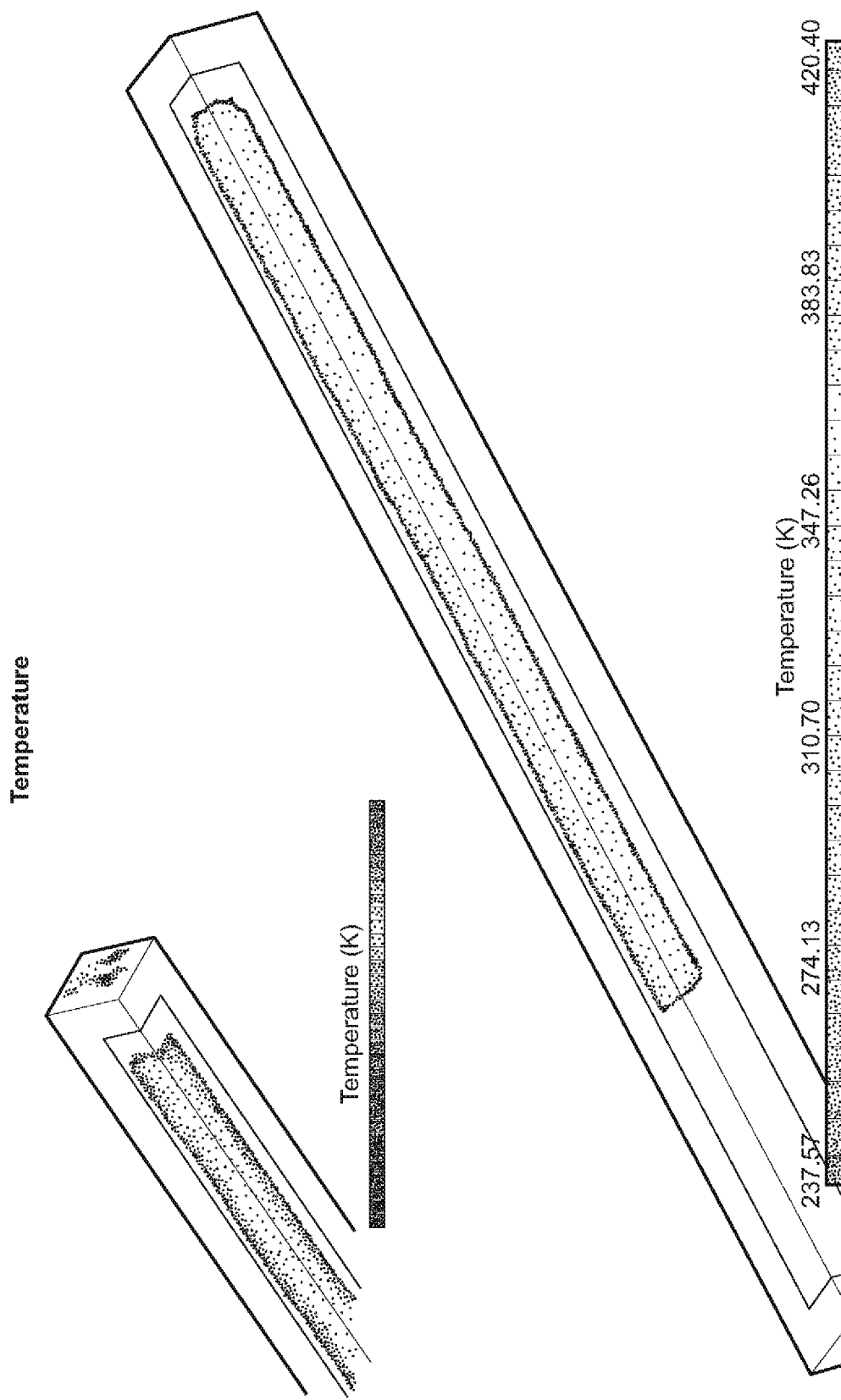
FIG. 20 illustrates an example of the temperature variations in a wickless capillary driven heat pipe of an example embodiment, shown using a prior art simulation tool.

FIG. 20 illustrates an example of the temperature variations in a wickless capillary driven heat pipe of an example embodiment, shown using a prior art simulation tool.

Figure 21:
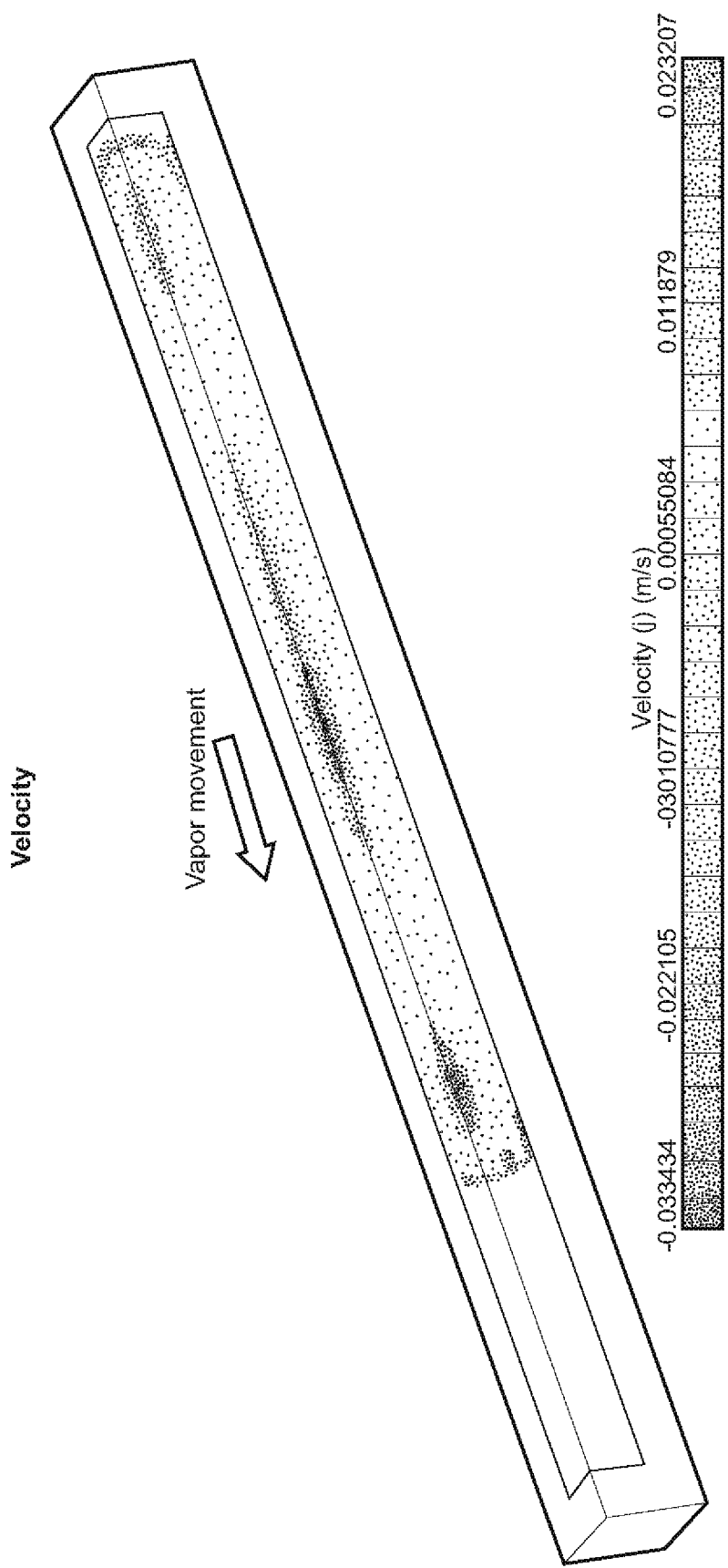
FIG. 21 illustrates an example of the vapor movement velocity variations in a wickless capillary driven heat pipe of an example embodiment, shown using a prior art simulation tool.

FIG. 21 illustrates an example of the vapor movement velocity variations in a wickless capillary driven heat pipe of an example embodiment, shown using a prior art simulation tool.

Figure 22:
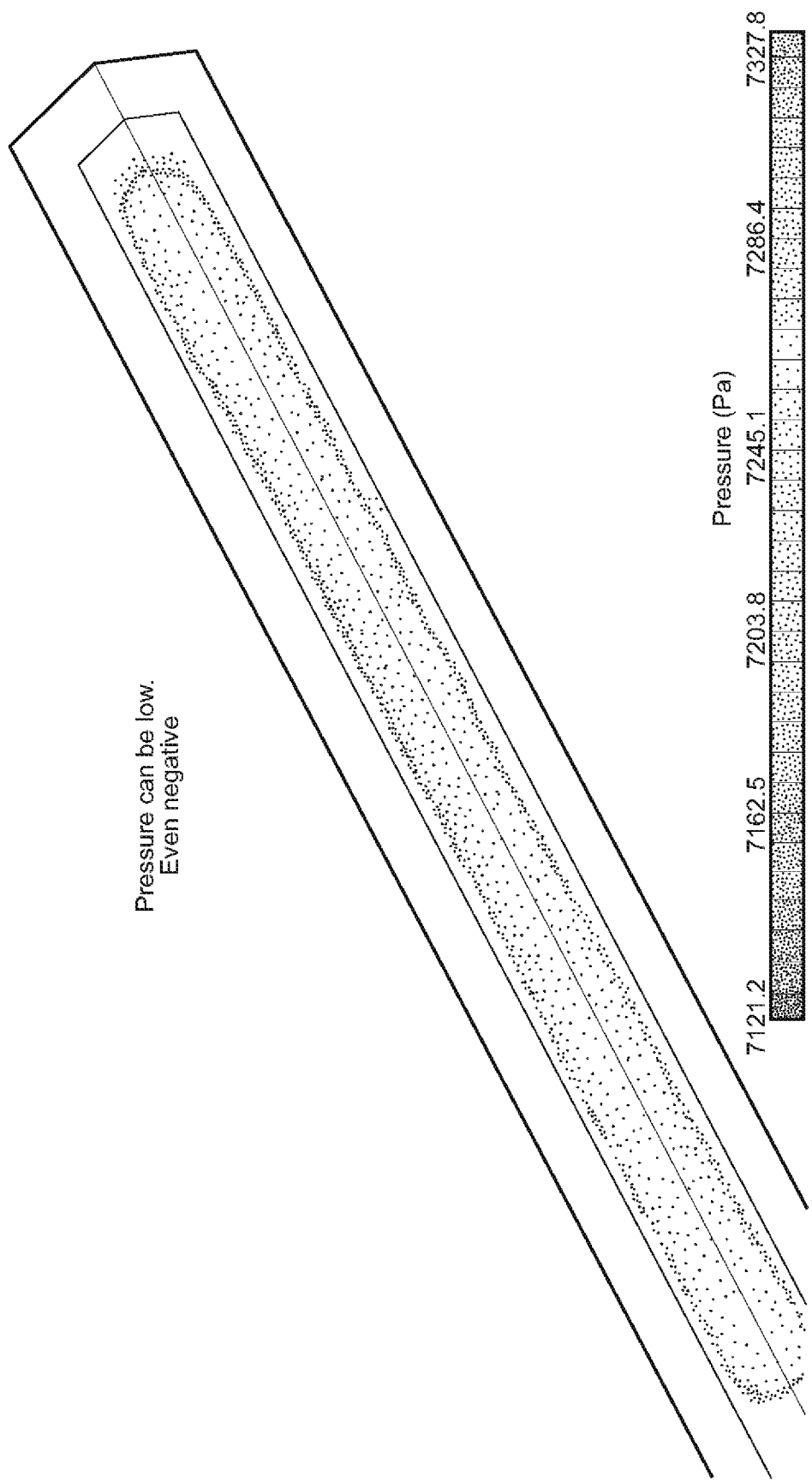
FIG. 22 illustrates an example of the pressure variations in a wickless capillary driven heat pipe of an example embodiment, shown using a prior art simulation tool.

FIG. 22 illustrates an example of the pressure variations in a wickless capillary driven heat pipe of an example embodiment, shown using a prior art simulation tool.

Figure 23:
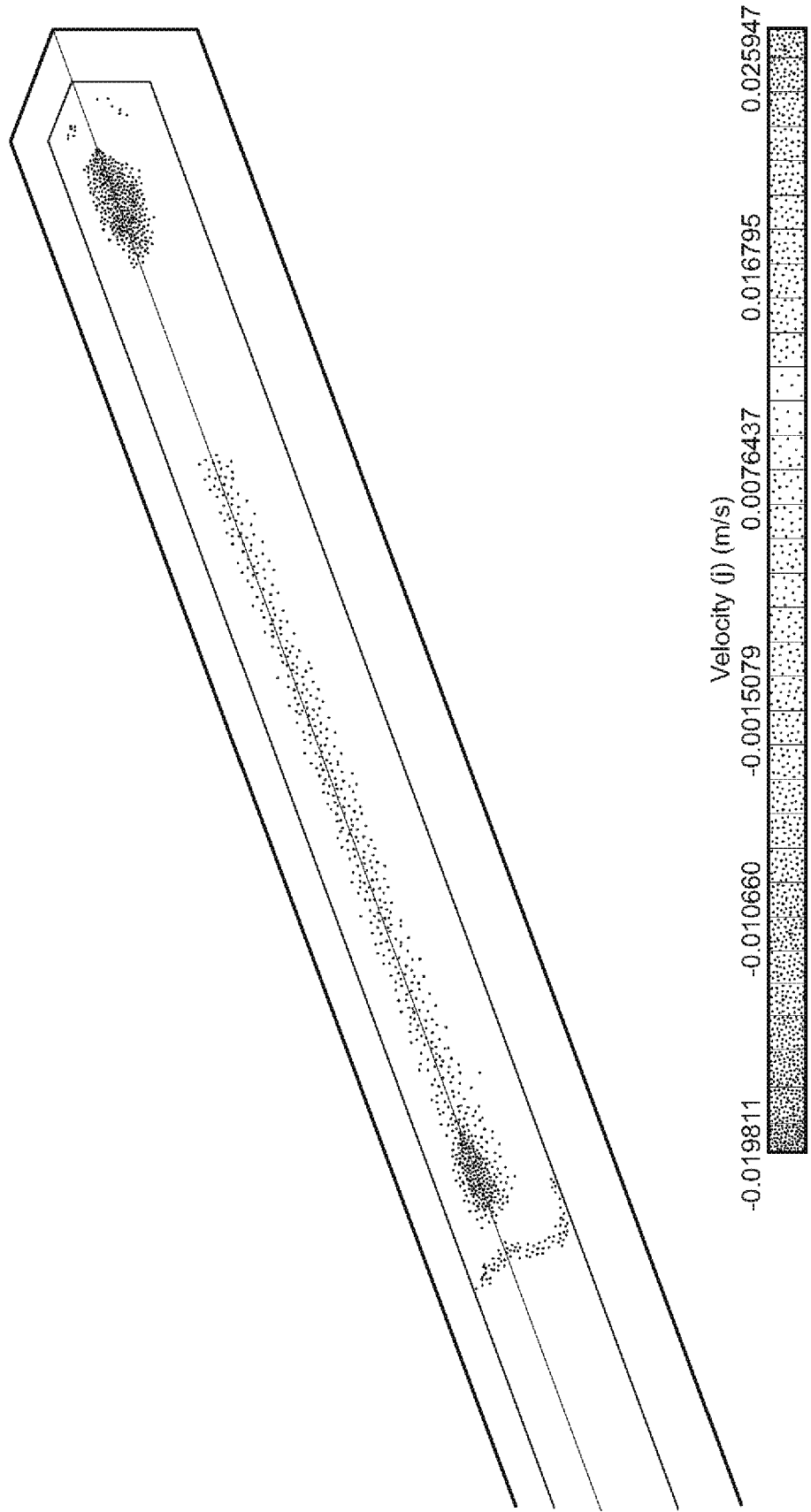
FIG. 23 illustrates an example of the velocity variations in a wickless capillary driven heat pipe of an example embodiment, shown using a prior art simulation tool.

FIG. 23 illustrates an example of the velocity variations in a wickless capillary driven heat pipe of an example embodiment, shown using a prior art simulation tool.

As described above, the wickless CVB heat pipes of the various embodiments can be formed in a variety of shapes and configurations and fabricated in a variety of ways to accommodate a variety of different applications. Some of these applications for various example embodiments are described in more detail below.

Application in Rack Servers

Figure 24:
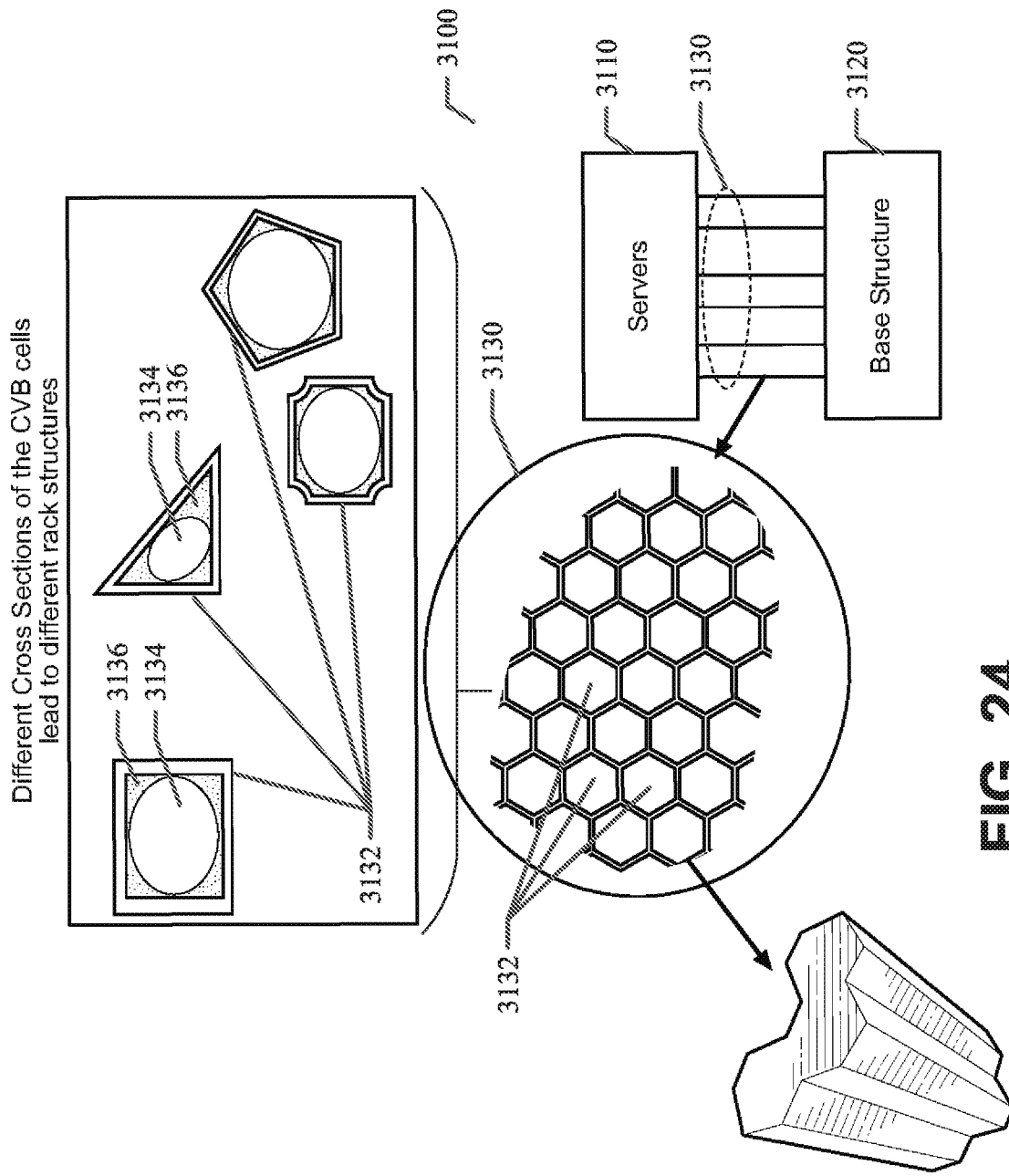
FIG. 24 illustrates an example embodiment of innovative channel geometries to create efficient heat transfer structures for servers.

FIG. 24 illustrates an example embodiment of thermally efficient rack structures 3100 for servers or other power-consuming or power-generating devices. FIG. 24 also illustrates example embodiments of innovative channel geometries to create efficient heat transfer structures for servers or other heat-generating devices. In a particular example embodiment, clusters of wickless capillary driven heat pipe cells can be embedded into the particular channel geometry of a server rack structure to improve the efficiency of the heat transfer mechanism. In the described example embodiments, these techniques can create thermally efficient rack structures for servers or other heat-generating devices.

Referring to FIG. 24, a server 3110 is shown mounted to, installed on, connected with, or supported by a base structure 3120 via a heat transfer rack structure or one or more rack columns 3130. The base structure 3120, supporting the rack columns 3130, can be a seismic support structure fabricated from a thermally conductive material. In a particular embodiment, the base structure 3120 can be fabricated from hollow copper or aluminum and can be configured to contain a pool of liquid used to charge the wickless capillary driven heat pipe cells embedded within the channeled core structure of the rack columns 3130. The rack columns 3130, supported by base structure 3120 at a second end in a condenser region and supporting the server 3110 or other heat-generating device placed thereon at a first end in an evaporator region, can be an array of rack columns wherein each rack column can contain a cluster of CVB cells 3132 compacted closely together as shown in FIG. 24 for an example embodiment. Each CVB cell 3132 can include a wickless capillary driven heat pipe, such as the wickless capillary driven heat pipes described in detail above. In various alternative embodiments, different cross sections of the CVB wickless heat pipe cells 3132 in the rack structure 3130 can provide better or different thermal heat transfer efficiency for different rack structures. For example, as shown in FIG. 24, the CVB wickless heat pipe cells 3132 can be configured in a variety of cross-sectional shapes including: rectangular or square, triangular, round or oval, curved, other polygonal shapes, polygonal shapes with beveled corners, or other geometries with a closed internal cavity. As described in detail above, each CVB wickless heat pipe cell 3132 can include a constrained vapor bubble 3134 within a fluid 3136 contained in the cell 3132. As also described above, the movement of the bubble 3134 and the fluid 3136 within each cell 3132 serves to improve the thermal transfer and excess heat dissipation in each rack column 3130. As a result, the thermal transfer and excess heat dissipation from the server 3110 or other heat-generating device connected to or in thermal contact with the rack columns 3130 is improved. In the example embodiment shown in FIG. 24, a hexagonal-shaped CVB wickless heat pipe cell 3132 cross-section allows the creation of an enhanced shared area with adjacent cells within the rack column 3130. The shared area between adjacent cells can increase the transfer of heat between cells. Cross-sectional shapes with more corners can increase the capillary action of the wickless heat pipe cells 3132 and thus improve excess heat dissipation. The embodiment shown in FIG. 24 can provide several benefits, including more efficient heat transfer from servers or other heat-generating devices in a rack structure. The embodiment shown in FIG. 24 also provides a new rack column 3130 structure fabricated with hollow cells of various cross-sectional shapes for embedding an array of CVB wickless heat pipe cells 3132 therein to improve excess heat dissipation. The one or more rack columns 3130 with embedded CVB wickless heat pipe cells 3132 can be configured as pillars of varying lengths coupled with a seismic base structure 3120 on one side and a server 3110 or other heat-generating device on another side. In an alternative embodiment, the base structure 3120 can contain a pool of liquid and thereby serve as a cooling fluid reservoir. In each of the described example embodiments, excess heat can be efficiently transferred from the server 3110 or other heat-generating device to the base structure 3120 in less time, with less power, and without moving parts. The embodiment shown in FIG. 24 can provide several advantages over the existing technologies including lighter weight, a new rack column 3130 structure fabricated with hollow cells of various cross-sectional shapes, less fan power, and reduced airflow.

Figure 25:
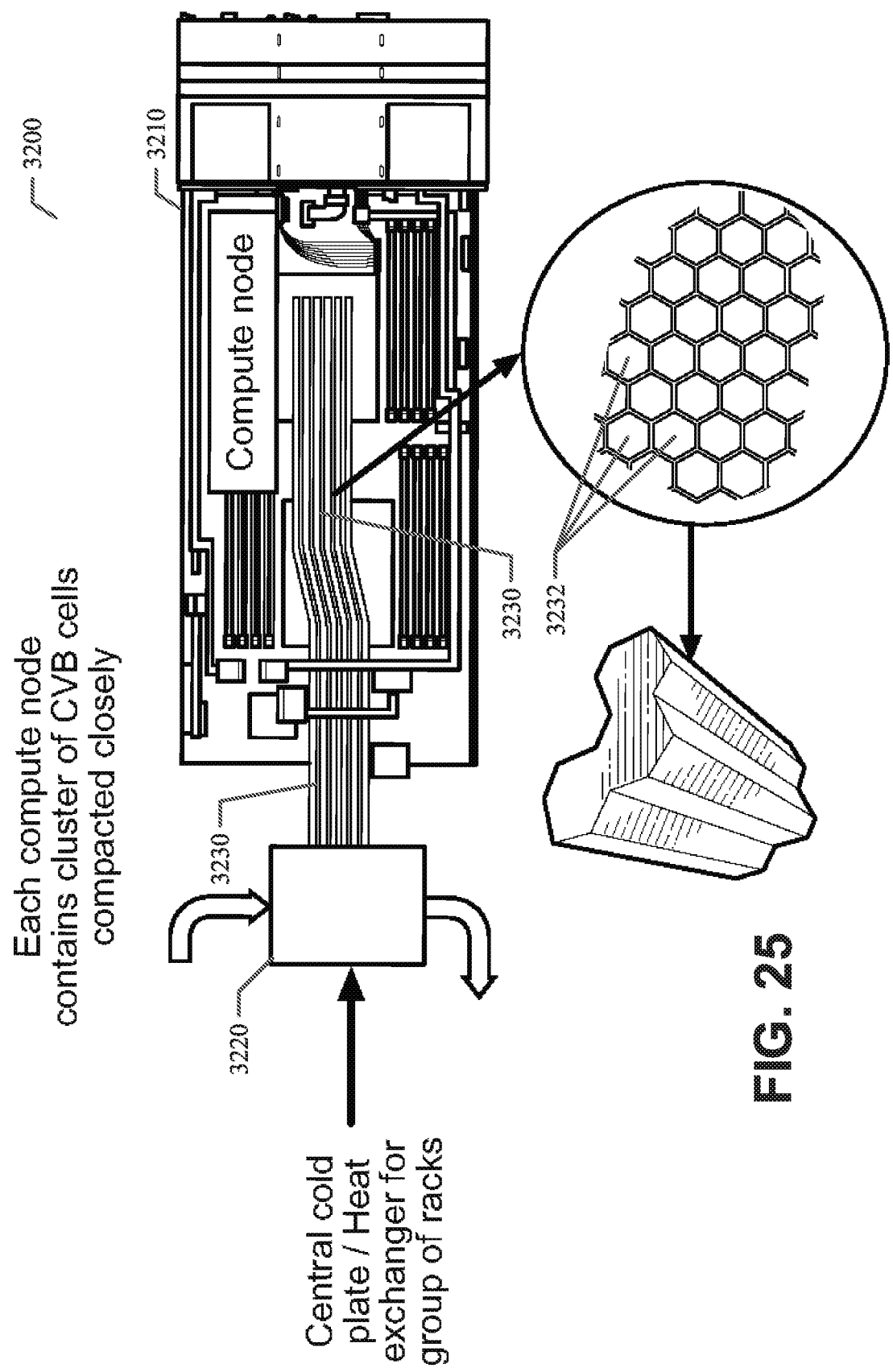
FIG. 25 illustrates an example embodiment of a compute node with a cluster of CVB cells compacted closely together and acting as heat carrier to the cold plate out of the node.

FIG. 25 illustrates an example embodiment of a heat transfer mechanism 3200 supporting a compute node 3210 with a cluster of CVB cells 3230 compacted closely together and acting as heat carrier to the cold plate out of the node. As is well-known in the art, rack servers or other electronic devices can include one or more compute nodes 3210, which can be data communication via a common bus, a local network interface, or other data transfer system. Typical compute nodes 3210 can include one or more general processing cores, one or more graphics cores, other processing logic, memory devices, and other electronic devices or components, which can communicate with each other via a bus or other data transfer system. A typical rack server can include one or more compute nodes 3210 and other processing and power control logic interconnected via the data transfer system. In many cases, the one or more compute nodes 3210 in each rack server are contained in an enclosed housing. As each rack server is powered up and used in normal operations, the components on the one or more compute nodes 3210 in each rack server can heat up, because of the electrical power applied to each component. The excess heat build-up from each component and the combinations of components of each compute node 3210 can quickly reach operational temperature limits, beyond which can cause component damage. As a result, logic within the compute node 3210 and/or the rack servers will limit the functionality, timing, speed, and/or operation of the compute node 3210 components to maintain temperatures below the operational temperature limits. Thus, the excess heat generated by the compute nodes 3210 in the rack servers can cause a reduction or a limitation in the operational functionality and capabilities of the compute nodes 3210.

The various embodiments of a heat transfer mechanism described herein serve to reduce or dissipate the excess heat generated by the compute nodes 3210 in the rack servers, thereby enabling the compute nodes 3210 to perform at a higher level of functionality and performance. An example embodiment of a heat transfer mechanism 3200 supporting a compute node 3210 is shown in FIG. 25. Referring to FIG. 25, a compute node 3210 of heat transfer mechanism 3200 includes a CVB cell cluster 3230 in direct thermal contact with one or more surfaces of the compute node 3210 and/or the components thereon. The CVB cell cluster 3230 comprises an array of channeled core structures or cells in which a plurality of CVB wickless heat pipes 3232 are embedded to improve excess heat dissipation from each compute node 3210. Each CVB cell 3232 can include a wickless capillary driven heat pipe, such as the wickless capillary driven heat pipes described in detail above. In various alternative embodiments, different cross sections of the CVB wickless heat pipe cells 3232 (e.g., see FIG. 24, cells 3132) in the CVB cell cluster 3230, shown in FIG. 25, can provide better or different thermal heat transfer efficiency for different compute node structures. For example, as shown in FIG. 24, the CVB wickless heat pipe cells 3232 can be configured in a variety of cross-sectional shapes including: rectangular or square, triangular, round or oval, curved, other polygonal shapes, polygonal shapes with beveled corners, or other geometries with a closed internal cavity. As described in detail above, each CVB wickless heat pipe cell 3232 can include a constrained vapor bubble within a fluid contained in the cell 3232. As also described above, the movement of the bubble and the fluid within each cell 3232 serves to improve the thermal transfer and excess heat dissipation in each cell of the CVB cell cluster 3230. As a result, the thermal transfer and excess heat dissipation from the compute node 3210 is improved. In the example embodiment shown in FIG. 25, a hexagonal-shaped CVB wickless heat pipe cell 3232 cross-section allows the creation of an enhanced shared area with adjacent cells within the CVB cell cluster 3230. The shared area between adjacent cells can increase the transfer of heat between cells. Cross-sectional shapes with more corners can increase the capillary action of the wickless heat pipe cells 3232 and thus improve excess heat dissipation. At a first end in an evaporator region, the CVB cell cluster 3230 can be in direct thermal contact with particular components on the compute node 3210 and/or routed to several heat-generating components on the compute node 3210. The CVB cell cluster 3230 can be attached to the compute node 3210, and/or the components thereon, using a thermally conductive adhesive, a soldering or welding process, or a mechanical attachment mechanism. At a second end in a condenser region, the CVB cell cluster 3230 can be in direct thermal contact with a heat exchanger, a cold plate, or other base element 3220. The heat exchanger, cold plate, or other base element 3220 can be in thermal contact with a central cooling system, such as a central air-cooling or liquid-cooling system. The base element 3220 serves to remove the excess heat transferred thereto via the CVB cell cluster 3230. As a result, excess heat can be efficiently transferred and removed from any or all of the heat generating components of the compute node 3210. In a similar fashion, excess heat can be efficiently transferred and removed from any or all of the compute nodes 3210 of a rack server or other heat-generating electronic device.

In the example embodiments illustrated in FIG. 25, this heat transfer mechanism can deliver thermal management directly to the compute node 3210 of each server or other heat-generating device. A heat exchanger, cold plate, or other base element 3220 can be provided to service one or a group of server racks and the servers or other heat generating devices therein. As described above, different cross sections of the CVB cells 3232 in the CVB cell cluster 3230 can provide better efficiency for the different rack and compute node structures.

Referring now to FIG. 26, a processing flow diagram illustrates an example embodiment of a method 1100 as described herein. The method 1100 of an example embodiment includes: fabricating a base structure from a material with highly heat conductive properties (processing block 1110); fabricating a rack column containing a constrained vapor bubble (CVB) cell cluster including a plurality of cells, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between an evaporator region and a condenser region (processing block 1120); supporting a heat-generating device with the rack column at a first end in an evaporator region wherein the heat-generating device is in thermal contact with the first end of the rack column (processing block 1130); and using the base structure to support the rack column at a second end in a condenser region to enable thermal transfer between the heat-generating device and the base structure via the rack column (processing block 1140).

Embodiments described herein are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size can be manufactured. In addition, well-known power/ground connections to integrated circuit (IC) chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the system platform within which the embodiment is to be implemented, i.e., such specifics should be well within purview of one of ordinary skill in the art. Where specific details (e.g., circuits) are set forth in order to describe example embodiments, it should be apparent to one of ordinary skill in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Included herein is a set of process or logic flows representative of example methodologies for performing novel aspects of the disclosed architecture. While, for purposes of simplicity of explanation, the one or more methodologies shown herein are shown and described as a series of acts, those of ordinary skill in the art will understand and appreciate that the methodologies are not limited by the order of acts. Some acts may, in accordance therewith, occur in a different order and/or concurrently with other acts from those shown and described herein. For example, those of ordinary skill in the art will understand and appreciate that a methodology can alternatively be represented as a series of interrelated states or events, such as in a state diagram. Moreover, not all acts illustrated in a methodology may be required for a novel implementation. A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The example embodiments disclosed herein are not limited in this respect.

The various elements of the example embodiments as previously described with reference to the figures may include or be used with various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The example embodiments described herein provide a technical solution to a technical problem. The various embodiments improve the functioning of the electronic device and a related system by enabling the fabrication and use of systems and methods for providing and using a wickless capillary driven constrained vapor bubble heat pipe to dissipate heat. The various embodiments also serve to transform the state of various system components based on better thermal dissipation characteristics of the electronic devices and systems. Additionally, the various embodiments effect an improvement in a variety of technical fields including the fields of thermal management, electronic systems and device fabrication and use, circuit board fabrication, semiconductor device fabrication and use, computing and networking devices, and mobile communication devices.

Figure 27:
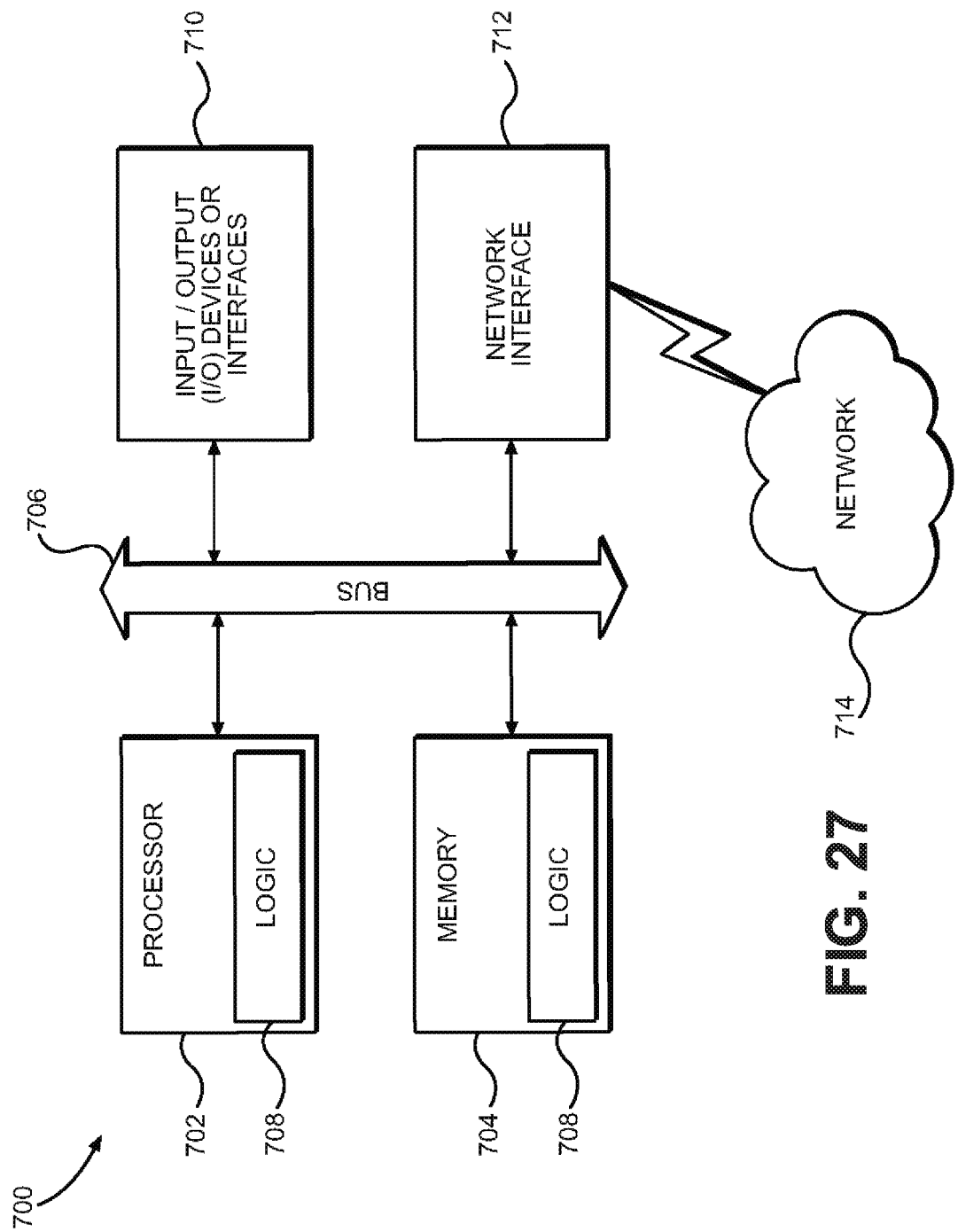
FIG. 27 shows a diagrammatic representation of a machine in the example form of a mobile computing and/or communication system within which a set of instructions when executed and/or processing logic when activated may cause the machine to perform any one or more of the methodologies described and/or claimed herein.

FIG. 27 illustrates a diagrammatic representation of a machine in the example form of an electronic device, such as a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip [SoC], general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that store the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

With general reference to notations and nomenclature used herein, the description presented herein may be disclosed in terms of program procedures executed on a computer or a network of computers. These procedural descriptions and representations may be used by those of ordinary skill in the art to convey their work to others of ordinary skill in the art.

A procedure is generally conceived to be a self-consistent sequence of operations performed on electrical, magnetic, or optical signals capable of being stored, transferred, combined, compared, and otherwise manipulated. These signals may be referred to as bits, values, elements, symbols, characters, terms, numbers, or the like. It should be noted, however, that all of these and similar terms are to be associated with the appropriate physical quantities and are merely convenient labels applied to those quantities. Further, the manipulations performed are often referred to in terms such as adding or comparing, which operations may be executed by one or more machines. Useful machines for performing operations of various embodiments may include general-purpose digital computers or similar devices. Various embodiments also relate to apparatus or systems for performing these operations. This apparatus may be specially constructed for a purpose, or it may include a general-purpose computer as selectively activated or reconfigured by a computer program stored in the computer. The procedures presented herein are not inherently related to a particular computer or other apparatus. Various general-purpose machines may be used with programs written in accordance with teachings herein, or it may prove convenient to construct more specialized apparatus to perform methods described herein.

Various example embodiments using these new techniques are described in more detail herein. In various embodiments as described herein, example embodiments include at least the following examples.

A rack structure comprising: a base structure; and a rack column supported by the base structure, the rack column in thermal coupling with a heat-generating device, the rack column containing a constrained vapor bubble (CVB) cell cluster including a plurality of cells in thermal coupling with the heat-generating device at a first end in an evaporator region and in thermal coupling with the base structure at a second end in a condenser region, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between the evaporator region and the condenser region.

The rack structure as described above wherein each cell of the plurality of cells is of a cross-sectional shape from the group consisting of: rectangular, square, triangular, round, curved, oval, a polygonal shape, a polygonal shape with beveled corners, and a geometry with a closed internal cavity.

The rack structure as described above wherein each cell of the plurality of cells is fabricated from a thermally conductive material.

The rack structure as described above wherein the base structure includes a cooling fluid reservoir for filling the capillary of each embedded wickless capillary driven constrained vapor bubble heat pipe with the highly wettable liquid.

A heat transfer apparatus comprising: a base element; and a constrained vapor bubble (CVB) cell cluster including a plurality of cells in thermal coupling with a compute node at a first end in an evaporator region and in thermal coupling with the base element at a second end in a condenser region, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between the evaporator region and the condenser region.

The heat transfer apparatus as described above wherein each cell of the plurality of cells is of a cross-sectional shape from the group consisting of: rectangular, square, triangular, round, curved, oval, a polygonal shape, a polygonal shape with beveled corners, and a geometry with a closed internal cavity.

The heat transfer apparatus as described above wherein each cell of the plurality of cells is fabricated from a thermally conductive material.

The heat transfer apparatus as described above wherein each cell of the plurality of cells is in direct thermal contact with at least one component of the compute node.

The heat transfer apparatus as described above wherein the base element is a heat exchanger or a cold plate.

A system comprising: a base structure; a rack column supported by the base structure, the rack column containing a constrained vapor bubble (CVB) cell cluster including a plurality of cells in thermal coupling with the heat-generating device at a first end in an evaporator region and in thermal coupling with the base structure at a second end in a condenser region, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between the evaporator region and the condenser region; and a heat-generating device placed in thermal coupling with the base structure.

The system as described above wherein each cell of the plurality of cells is of a cross-sectional shape from the group consisting of: rectangular, square, triangular, round, curved, oval, a polygonal shape, a polygonal shape with beveled corners, and a geometry with a closed internal cavity.

The system as described above wherein each cell of the plurality of cells is fabricated from a thermally conductive material.

The system as described above wherein the base structure includes a cooling fluid reservoir for filling the capillary of each embedded wickless capillary driven constrained vapor bubble heat pipe with the highly wettable liquid.

A method comprising: fabricating a base structure from a material with highly heat conductive properties; fabricating a rack column containing a constrained vapor bubble (CVB) cell cluster including a plurality of cells, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between an evaporator region and a condenser region; supporting a heat-generating device with the rack column at a first end in the evaporator region wherein the heat-generating device is in thermal contact with the first end of the rack column; and using the base structure to support the rack column at a second end in the condenser region to enable thermal transfer between the heat-generating device and the base structure via the rack column.

The method as described above wherein cell of the plurality of cells is of a cross-sectional shape from the group consisting of: rectangular, square, triangular, round, curved, oval, a polygonal shape, a polygonal shape with beveled corners, and a geometry with a closed internal cavity.

The method as described above wherein each cell of the plurality of cells is fabricated from a thermally conductive material.

The method as described above including fabricating the base structure with a cooling fluid reservoir for filling the capillary of each embedded wickless capillary driven constrained vapor bubble heat pipe with the highly wettable liquid.

A method comprising: fabricating a base element from a material with highly heat conductive properties; fabricating a constrained vapor bubble (CVB) cell cluster including a plurality of cells, each cell of the plurality of cells having a wickless capillary driven CVB heat pipe embedded in the cell, each wickless capillary driven CVB heat pipe including a body having a capillary therein with generally square corners and a high energy interior surface, and a highly wettable liquid partially filling the capillary to dissipate heat between an evaporator region and a condenser region; thermally coupling a compute node with the CVB cell cluster at a first end in the evaporator region; and thermally coupling the base element with the CVB cell cluster at a second end in the condenser region to enable thermal transfer between the compute node and the base element via the CVB cell cluster.

The method as described above wherein each cell of the plurality of cells is of a cross-sectional shape from the group consisting of: rectangular, square, triangular, round, curved, oval, a polygonal shape, a polygonal shape with beveled corners, and a geometry with a closed internal cavity.

The method as described above wherein each cell of the plurality of cells is fabricated from a thermally conductive material.

The method as described above wherein each cell of the plurality of cells is in direct thermal contact with at least one component of the compute node.

The method as described above wherein the base element is a heat exchanger or a cold plate.

An apparatus comprising: a base structure means; and a rack column means supported by the base structure means, the rack column means in thermal coupling with a heat-generating device, the rack column means containing a constrained vapor bubble (CVB) cell cluster including a plurality of cells in thermal coupling with the heat-generating device at a first end in an evaporator region and in thermal coupling with the base structure means at a second end in a condenser region, each cell of the plurality of cells having a wickless heat dissipation means embedded in the cell, each wickless heat dissipation means including a body having a capillary therein with generally square corners and a high energy interior surface, and a highly wettable liquid partially filling the capillary to dissipate heat between the evaporator region and the condenser region.

The apparatus as described above wherein each cell of the plurality of cells is of a cross-sectional shape from the group consisting of: rectangular, square, triangular, round, curved, oval, a polygonal shape, a polygonal shape with beveled corners, and a geometry with a closed internal cavity.

The apparatus as described above wherein each cell of the plurality of cells is fabricated from a thermally conductive material.

The apparatus as described above wherein the base structure includes a cooling fluid reservoir for filling the capillary of each embedded wickless heat dissipation means with the highly wettable liquid.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A rack comprising:
   a base; and
   a rack column supported by the base, the rack column to thermally couple with a heat-generating device, the rack column containing a constrained vapor bubble (CVB) cell cluster including a plurality of cells to thermally couple with the heat-generating device at a first end and to thermally couple with the base at a second end, one or more of the cells of the plurality of cells having a wickless capillary driven CVB heat pipe embedded in the cell, one or more of the wickless capillary driven CVB heat pipes including a capillary having a longitudinal axis and a cross-sectional shape orthogonal to the longitudinal axis, the cross-sectional shape including:
      a first square corner at an intersection of a first straight edge and a second straight edge,
      a first curved wall, the first straight edge coupled directly to the first curved wall,
      a second curved wall, the second straight edge coupled directly to the second curved wall,
      a second square corner at an intersection of a third straight edge and a fourth straight edge, the third straight edge coupled directly to the second curved wall, the second straight edge and the third straight edge aligned such that a first line segment would include and connect the second straight edge and the third straight edge, the second curved wall bowing outward between the second straight edge and the third straight edge on a side of the first line segment opposite a center of the capillary,
      a third curved wall, the fourth straight edge coupled directly to the third curved wall,
      a third square corner formed at an intersection of a fifth straight edge and a sixth straight edge, the fifth straight edge coupled directly to the third curved wall, the fourth straight edge and the fifth straight edge aligned such that a second line segment would include and connect the fourth straight edge and the fifth straight edge, the third curved wall bowing outward between the fourth straight edge and the fifth straight edge on a side of the second line segment opposite the center of the capillary,
      a fourth curved wall, the sixth straight edge coupled directly to the fourth curved wall, and
      a fourth square corner formed at an intersection of a seventh straight edge and an eighth straight edge, the seventh straight edge coupled directly to the fourth curved wall,
      the sixth straight edge and the seventh straight edge aligned such that a third line segment would include and connect the sixth straight edge and the seventh straight edge, the fourth curved wall bowing outward between the sixth straight edge and the seventh straight edge on a side of the third line segment opposite the center of the capillary, the eighth straight edge coupled directly to the first curved wall, the eighth straight edge and the first straight edge aligned such that a fourth line segment would include and connect the eighth straight edge and the first straight edge, the first curved wall bowing outward between the eighth straight edge and the first straight edge on a side of the fourth line segment opposite the center of the capillary.

2. The rack of claim 1, wherein the one or more of the plurality of cells is fabricated from a thermally conductive material.

3. The rack of claim 1, wherein the base includes a cooling fluid reservoir to fill the capillary of the one or more of the embedded wickless capillary driven CVB heat pipes with a wettable liquid.

4. The rack of claim 1, wherein the base includes a cold plate.

5. The rack of claim 1, wherein the one or more of the plurality of cells has a cross-sectional shape that includes a geometry with a closed internal cavity.

6. The rack of claim 1, wherein the one or more of the plurality of cells has a cross-sectional shape that is a polygonal shape.

7. A system comprising:
a base;
a heat-generating device in thermal coupling with the base; and
a rack column coupled to the base, the rack column including a constrained vapor bubble (CVB) cell cluster including a plurality of cells in thermal coupling with the heat-generating device and in thermal coupling with the base, one or more of the cells of the plurality of cells having a wickless capillary driven CVB heat pipe embedded in the cell, one or more of the wickless capillary driven CVB heat pipes including a capillary having a longitudinal axis and a cross-sectional shape orthogonal to the longitudinal axis, the cross-sectional shape including:
a first square corner formed at an intersection of a first straight edge and a second straight edge,
a first curved wall, the first straight edge coupled directly to the first curved wall,
a second curved wall, the second straight edge coupled directly to the second curved wall,
a second square corner formed at an intersection of a third straight edge and a fourth straight edge, the third straight edge coupled directly to the second curved wall, the second straight edge and the third straight edge aligned such that a first line segment would include and connect the second straight edge and the third straight edge, the second curved wall bowing outward between the second straight edge and the third straight edge on a side of the first line segment opposite a center of the capillary,
a third curved wall, the fourth straight edge coupled directly to the third curved wall,
a third square corner formed at an intersection of a fifth straight edge and a sixth straight edge, the fifth straight edge coupled directly to the third curved wall, the fourth straight edge and the fifth straight edge aligned such that a second line segment would include and connect the fourth straight edge and the fifth straight edge, the third curved wall bowing outward between the fourth straight edge and the fifth straight edge on a side of the second line segment opposite the center of the capillary,
a fourth curved wall, the sixth straight edge coupled directly to the fourth curved wall, and
a fourth square corner formed at an intersection of a seventh straight edge and an eighth straight edge, the seventh straight edge coupled directly to the fourth curved wall,
the sixth straight edge and the seventh straight edge aligned such that a third line segment would include and connect the sixth straight edge and the seventh straight edge, the fourth curved wall bowing outward between the sixth straight edge and the seventh straight edge on a side of the third line segment opposite the center of the capillary, the eighth straight edge coupled directly to the first curved wall, the eighth straight edge and the first straight edge aligned such that a fourth line segment would include and connect the eighth straight edge and the first straight edge, the first curved wall bowing outward between the eighth straight edge and the first straight edge on a side of the fourth line segment opposite the center of the capillary.

8. The system of claim 7, wherein the base includes a cold plate.

9. A method comprising:
fabricating a base from a material with heat conductive properties;
fabricating a rack column containing a constrained vapor bubble (CVB) cell cluster, the CVB cell cluster including a plurality of cells, one or more of the plurality of cells having a wickless capillary driven CVB heat pipe embedded in the cell, one or more of the wickless capillary driven CVB heat pipes including a capillary having a longitudinal axis and a cross-sectional shape orthogonal to the longitudinal axis, the cross-sectional shape including:
a first square corner formed at an intersection of a first straight edge and a second straight edge,
a first curved wall, the first straight edge coupled directly to the first curved wall,
a second curved wall, the second straight edge coupled directly to the second curved wall,
a second square corner formed at an intersection of a third straight edge and a fourth straight edge, the third straight edge coupled directly to the second curved wall, the second straight edge and the third straight edge aligned such that a first line segment would include and connect the second straight edge and the third straight edge, the second curved wall bowing outward between the second straight edge and the third straight edge on a side of the first line segment opposite a center of the capillary,
a third curved wall, the fourth straight edge coupled directly to the third curved wall,
a third square corner formed at an intersection of a fifth straight edge and a sixth straight edge, the fifth straight edge coupled directly to the third curved wall, the fourth straight edge and the fifth straight edge aligned such that a second line segment would include and connect the fourth straight edge and the fifth straight edge, the third curved wall bowing outward between the fourth straight edge and the fifth straight edge on a side of the second line segment opposite the center of the capillary,
a fourth curved wall, the sixth straight edge coupled directly to the fourth curved wall, and a fourth square corner formed at an intersection of a seventh straight edge and an eighth straight edge, the seventh straight edge coupled directly to the fourth curved wall, the sixth straight edge and the seventh straight edge aligned such that a third line segment would include and connect the sixth straight edge and the seventh straight edge, the fourth curved wall bowing outward between the sixth straight edge and the seventh straight edge on a side of the third line segment opposite the center of the capillary, the eighth straight edge coupled directly to the first curved wall, the eighth straight edge and the first straight edge aligned such that a fourth line segment would include and connect the eighth straight edge and the first straight edge, the first curved wall bowing outward between the eighth straight edge and the first straight edge on a side of the fourth line segment opposite the center of the capillary;

supporting a heat-generating device with the rack column at a first end in an evaporator region, the heat-generating device in thermal communication with the first end of the rack column; and supporting the rack column with the base at a second end in a condenser region to enable thermal transfer between the heat-generating device and the base via the rack column.

10. The method of claim 9, further including fabricating the one or more of the plurality of cells from a thermally conductive material.

11. The method of claim 9, further including fabricating the base with a cooling fluid reservoir to fill the capillary of the one or more embedded wickless capillary driven CVB heat pipe with the wettable liquid.

\* \* \* \* \*